United States Patent
Park et al.

(10) Patent No.: US 8,039,054 B2
(45) Date of Patent: Oct. 18, 2011

(54) LAYER DEPOSITION METHODS

(75) Inventors: In-Sung Park, Seoul (KR);
Young-Wook Park, Gyeonggi-do (KR);
Myeong-Jin Kim, Gyeonggi-do (KR);
Eun-Taek Yim, Seoul (KR); Han-Mei Choi, Seoul (KR); Kyoung-Seok Kim, Seoul (KR); Beung-Keun Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1767 days.

(21) Appl. No.: 10/854,942

(22) Filed: May 27, 2004

(65) Prior Publication Data
US 2004/0237893 A1 Dec. 2, 2004

(30) Foreign Application Priority Data
May 29, 2003 (KR) .................. 10-2003-0034497

(51) Int. Cl.
*C23C 16/00* (2006.01)

(52) U.S. Cl. .................................. 427/255.23

(58) Field of Classification Search .............. 427/255.23
See application file for complete search history.

(56) References Cited

U.S. PATENT DOCUMENTS

| 6,323,129 B1 * | 11/2001 | Moutinho | 438/680 |
| 6,576,053 B1 * | 6/2003 | Kim et al. | 117/89 |
| 7,160,817 B2 * | 1/2007 | Marsh | 438/763 |
| 2004/0062081 A1 * | 4/2004 | Drewes | 365/185.28 |
| 2004/0115898 A1 * | 6/2004 | Moghadam et al. | 438/435 |
| 2004/0216665 A1 * | 11/2004 | Soininen et al. | 118/715 |

FOREIGN PATENT DOCUMENTS

KR 10-2000-0051044 A 8/2000
* cited by examiner

*Primary Examiner* — Michael Cleveland
*Assistant Examiner* — Robert Vetere
(74) *Attorney, Agent, or Firm* — Myers Bigel Sibley & Sajovec

(57) ABSTRACT

A layer deposition method includes: feeding a reactant with a first flow of an inert gas as a carrier gas into a reaction chamber to chemisorb the reactant on a substrate; feeding the first flow of the inert gas to purge the reaction chamber and a first reactant feed line; and feeding the second flow of the inert gas into the reaction chamber through a feed line different from the first reactant feed line.

23 Claims, 18 Drawing Sheets

LAYER DEPOSITION METHODS

RELATED APPLICATION

This application claims priority from Korean Patent Application No. 2003-34497, filed on May 29, 2003, which is hereby incorporated herein by reference in its entirety.

FIELD OF THE INVENTION

The present invention relates to semiconductor device fabrication methods, and more particularly, to methods for depositing a layer on a substrate.

BACKGROUND OF THE INVENTION

Generally, in a semiconductor device fabrication process, a layer or thin film is formed using a chemical vapor deposition method, a sputtering method and/or an atomic layer deposition (ALD) method, etc. The chemical vapor deposition method has an advantage in that the thin film can be formed to have excellent step coverage, but has a disadvantage in that the process temperature may be high and it may be difficult to control the thickness of the thin layer. By comparison, the sputtering method has an advantage in that the process temperature is low and a material layer can be formed without developing a precursor as may be required for vapor deposition. However, the sputtering method has a disadvantage in that step coverage may be poor.

Because the atomic layer deposition method can form an atomic monolayer at a low temperature, it can advantageously provide a layer having a low thickness, a uniform surface and excellent step coverage. Generally, the atomic layer deposition method employs a cycle including: a first feed step of feeding a first reaction gas into a reaction chamber to form a first reactant in the form of an atomic layer on a substrate; a first purge step of purging an internal section of the reaction chamber; a second feed step of feeding a second reaction gas into the reaction chamber to provide a chemical exchange reaction with the first reactant of the atomic layer; and a second purge step of purging the internal section of the reaction chamber. This cycle can be performed repeatedly to control the thickness of the layer.

In the atomic layer deposition method, because several atomic layers are laminated to form the desired layer, it is typical to feed the reaction gas in an amount sufficient to form the atomic layer. Further, because the precursor used for the reaction gas is expensive, the amount of the reaction gas used should be minimized. Because the atomic layer deposition method forms the atomic layer on a surface of the substrate by the chemi-substitution-reaction, it is necessary, before the reaction gas is fed, to completely purge the reactants incompletely physisorbed on the surface of the substrate from the internal section of the reaction chamber.

FIG. 1 is a flow chart representing a conventional layer deposition method. FIG. 2 is a timing diagram representing a conventional layer deposition method. Referring to FIGS. 1 and 2, in the conventional layer deposition method, a cycle for forming a layer is repeatedly performed, the cycle including the steps of: a first feed step t1, 10 for feeding the first reactant; a first purge step t2, 20 for purging the reaction chamber; a second feed step t3, 30 for feeding a second reactant; and a second purge step t4, 40 for purging the reaction chamber.

In the first feed step t1, 10 for feeding the first reactant into the reaction chamber, a first flow of an inert gas is used as a carrier gas and the first reactant is chemisorbed or physisorbed on the substrate. In the first purge step t2, 20, the first flow of the inert gas is fed to purge or remove the first reactant within the reaction chamber, within the first reactant feed lines, and physisorbed on the substrate. In the second feed step t3, 30, the second reactant is fed into the reaction chamber using the second flow of the inert gas as the carrier gas, and the first reactant chemisorbed on the substrate is chemically exchanged with the second reactant to form the layer. Thereafter, in the second purge step t4, 40, a second flow of an inert gas is fed to purge the reaction chamber and the second reactant feed line. The second reactant remaining in the reaction chamber and the second reactant feed line is removed along with the second reactant that is physisorbed on the substrate without chemi-substitution-reacting with the first reactant.

In the atomic layer deposition method, inert gas is used as the carrier gas and the purge gas. Accordingly, the amount of the reactant used as the precursor can be reduced by reducing the flow of the inert gas. The feed amount of the inert gas is controlled by a mass flow controller (MFC). In a general atomic layer deposition process, the feed step and the purge step are performed for a very short time of about one second, whereas the control response time of the mass flow controller may be the same as or longer than the process time for the feed step and the purge step. If the reactant feed line and the reaction chamber are not sufficiently purged in the purge step, not only may a non-uniform layer be formed, but the layer may also be formed so as to contain a non-required element or impurity. Accordingly, in order to purge the reactant feed line and the reaction chamber, a large amount of purge gas should be fed. However, as described above, because the mass flow controller cannot adjust the flow within the short time range allowed, if the amount of reactant consumed is reduced, the purge gas cannot be sufficiently fed in the purge step.

As a result, the conventional atomic layer deposition method has a drawback in that there is a limitation in reducing the amount of the reactant consumed. If the amount of the reactant consumed is reduced, the purging may not be performed sufficiently or smoothly.

SUMMARY OF THE INVENTION

According to embodiments of the present invention, a layer deposition method includes: feeding a reactant with a first flow of an inert gas as a carrier gas into a reaction chamber to chemisorb the reactant on a substrate; feeding the first flow of the inert gas to purge the reaction chamber and a reactant feed line; and feeding the second flow of the inert gas into the reaction chamber through a feed line different from the first reactant feed line.

The layer deposition methods according to embodiments of the present invention may further include: feeding a second reactant with a third flow of the inert gas as a carrier gas to form a chemical exchange layer in which a chemical exchange reaction is performed with the first reactant; feeding the third flow of the inert gas through a second reactant feed line to purge the reaction chamber and the second reactant feed line; and feeding a fourth flow of the inert gas into the reaction chamber through a feed line different from the second reactant feed line.

The layer deposition methods according to embodiments of the present invention may further include: feeding a second reactant into the reaction chamber to form a layer in which a chemical exchange reaction is performed with the first reactant; and feeding the inert gas to purge the reaction chamber and the second reactant feed line.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain principles of the invention. In the drawings.

DETAILED DESCRIPTION OF EMBODIMENTS OF THE INVENTION

Figure 1:
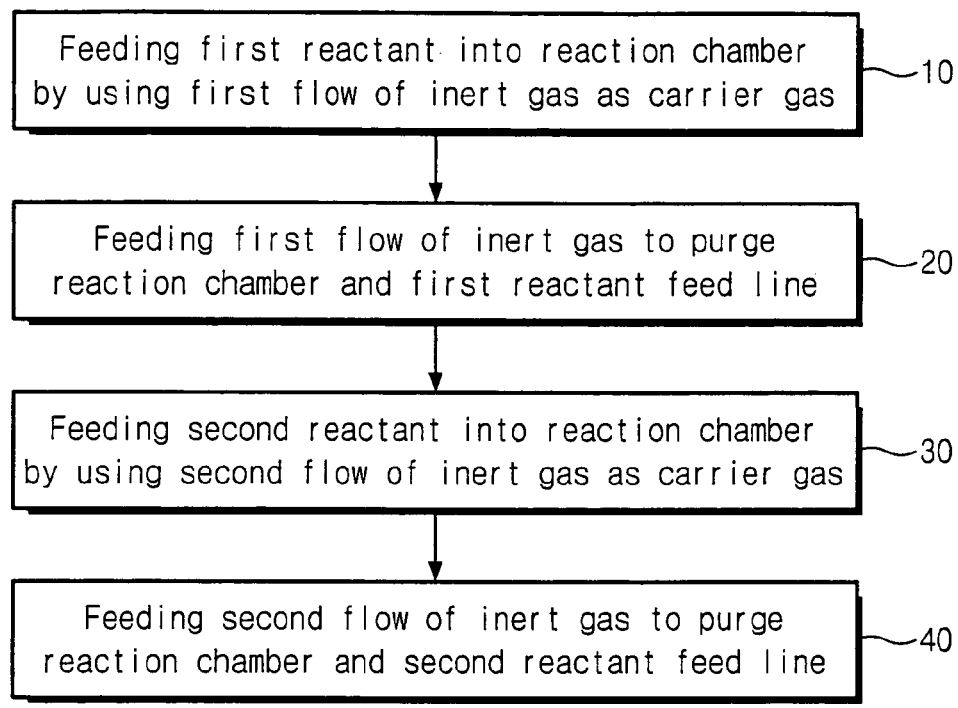
FIG. 1 is a flow chart representing a conventional layer deposition method.
Figure 2:
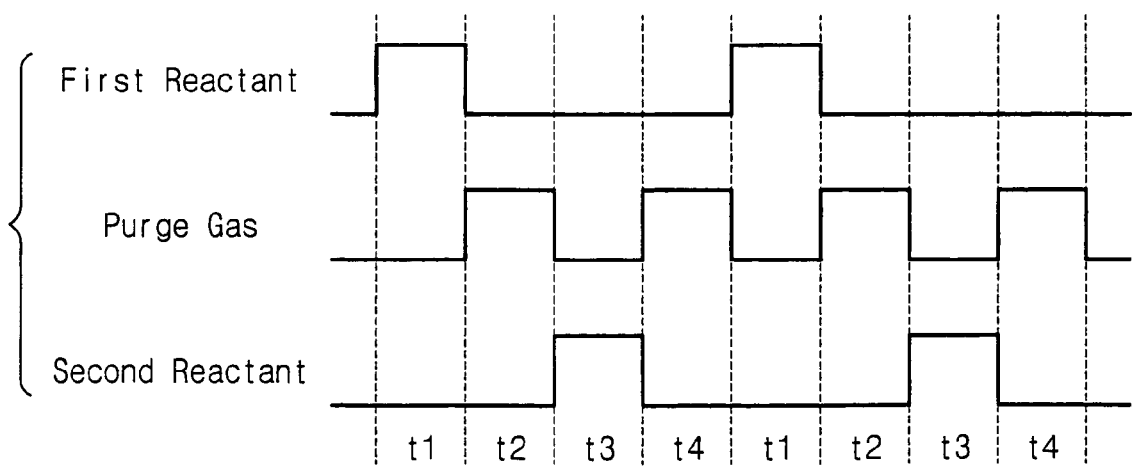
FIG. 2 is a timing diagram representing a conventional layer deposition method.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

In an aspect of the present invention, there is provided a layer deposition method including a two-step purge. In the layer deposition method, a reactant along with a first flow of an inert gas as a carrier gas is fed into a reaction chamber to chemisorb the reactant on a substrate, and then the two-step purge is performed. In a first purge step, the first flow of the inert gas is fed to purge the reaction chamber, especially the remaining reactant in the chamber, and a reactant feed line. In a second purge step, a second flow of an inert gas larger than the first flow of the inert gas is fed to purge the reaction chamber and the remaining reactant that is distributed non-uniformly on the wafer.

The first flow of the inert gas and the second flow of the inert gas can be fed through feed lines different from each other. For example, in the first purge step, the reactant remaining within the reaction chamber and the reactant feed line can be removed, and in the second purge step, the reactant remaining within the reaction chamber and the reactant physisorbed on the substrate can be removed. Additionally, in the first purge step, a portion of the reactant physisorbed on the substrate may be removed, and in the second purge step, the reactant remaining in a portion of the reactant feed line may be removed.

The present invention can be applied to a layer deposition process by feeding a small amount of the reactant. In particular, if a metal compound precursor is used as the reactant, an enhanced effect may be achieved.

The present invention can be applied to a process in which more than two kinds of reactants are fed to form the layer using chemical exchange reaction thereof. A reactant along with a first flow of an inert gas as a carrier gas is fed into a reaction chamber to chemisorb the reactant on a substrate, and a two-step purge is performed. In a first purge step, the first flow of the inert gas is fed to purge the reaction chamber and a reactant feed line. In a second purge step, a second flow of an inert gas is fed to purge the reaction chamber, the second flow having the same or a greater mass flow rate than the first flow. Thereafter, a second reactant along with a third flow of an inert gas as a carrier gas is fed to form a layer in which a chemical exchange reaction is performed with the first reactant, and a third purge step and a fourth purge step are performed. In the third purge step, a third flow of the inert gas is fed to purge the reaction chamber and the second reactant feed line. In the fourth purge step, a fourth flow of the inert gas is fed to purge the reaction chamber, the fourth flow having the same or a greater mass flow rate than the third flow.

Additionally, a third reactant along with a fifth flow of an inert gas as a carrier gas is fed into the reaction chamber to additionally perform chemi-substitution of the chemi-substitution-reaction layer such that a prescribed layer can be formed. Thereafter, the fifth flow of the inert gas is fed to purge the reaction chamber and the third reactant feed line.

At this time, the mass flow rates of the first flow and the third flow can be increased or reduced in proportion to a molecular weight of the reactant fed. The mass flow rates of the second flow and the fourth flow are respectively the same as or larger than those of the first flow and the third flow, and the mass flow rates of the second and fourth flows may be of the same amount. The mass flow rate of the fifth flow can be of the same amount as that of the second flow and the fourth flow.

In the first purge step, the first reactant disposed within the first reactant feed line and the reaction chamber and the first reactant physisorbed on the substrate can be purged. In the second purge step, the same or a larger amount (i.e., mass) of the inert gas can be fed through a route different from that of the first purge step to purge the first reactant disposed within the reaction chamber and the first reactant physisorbed on the substrate.

Further, in the third purge step, the second reactant disposed within the second reactant feed line and the reaction chamber and the second reactant physisorbed on the substrate can be purged. In the fourth purge step, the same or a larger amount (i.e., mass) of the inert gas can be fed through a route different from that of the first purge step to purge the second reactant disposed within the reaction chamber and the second reactant physisorbed on the substrate.

The two-step purge process of the present invention can be applied when a small amount of reactant is fed. Where the reactant is a metal-containing compound, the methods of the present invention may be particularly advantageous. However, where the reactant is an oxidizing agent or a nitriding agent at room temperature, a single purge process may also be used.

In accordance with further embodiments of the present invention, the two-step purge and the single purge are both applied. More particularly, a first reactant along with a first flow of an inert gas as a carrier gas is fed into a reaction chamber to chemisorb the first reactant on a substrate, and a two-step purge is performed. In a first purge step, the first flow of the inert gas is fed to purge the reaction chamber and a first reactant feed line. In a second purge step, a second flow of an inert gas is fed to purge the reaction chamber, the second flow having the same mass flow rate as or a greater mass flow rate than that of the first flow through the route different from that of the first purge step. Thereafter, a second reactant along with a third flow of an inert gas as a carrier gas is fed to form a layer in which chemi-substitution-reaction is performed with the first reactant, and the second flow of the inert gas is fed to purge the reaction chamber and the second reactant feed line. In the first purge step, the first reactant disposed within the first reactant feed line and the reaction chamber and the first reactant physisorbed on the substrate may be purged. In the second purge step, the second flow of the inert gas may be fed into the reaction chamber through a feed line different from the first reactant feed line, and the second flow of the inert gas can be used to purge the first reactant disposed within the reaction chamber and the first reactant physisorbed on the substrate.

Figure 3:
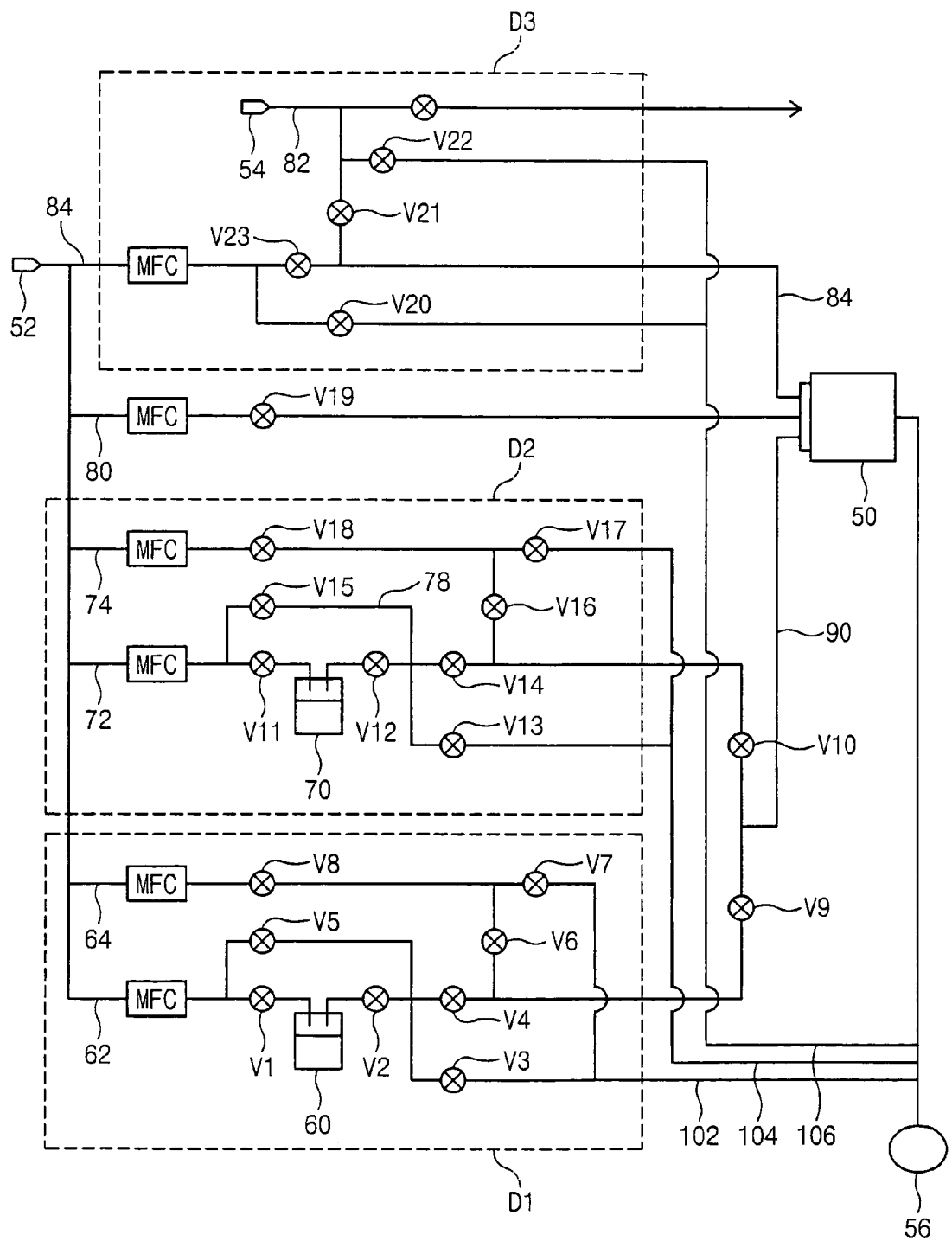
FIG. 3 is a schematic diagram of an atomic layer deposition apparatus for performing layer deposition methods according to embodiments of the present invention.

FIG. 3 shows an atomic layer deposition apparatus for performing layer deposition methods according to embodiments of the present invention. The layer deposition apparatus includes a reaction chamber 50, an exhaust pump 56, a plurality of reactant feeding units D1, D2 and D3, and a gas feeding source 52. The reactant feeding units D1 and D2 are for feeding reactants having a liquid or solid state at room temperature, and the reactant feeding unit D3 is for feeding reactants of a gas state. Generally, because the layer deposition apparatus includes the plurality of reactant feeding units, the reactant feeding units can be selected as needed. The reactant feeding units D1 and D2 include reactant containers 60 and 70 for storing the liquid or gaseous reactant therein. The reactant is carried to the reaction chamber 50 by the inert gas passing through the reactant containers 60 and 70. The inert gas is fed into the reaction chamber 50 through a plurality of feed lines 62, 64, 72, 74, 80 and 84 and a chamber line 90. A gas that is not in use or after process can be exhausted to an external location by the exhaust pump 56 through a plurality of exhaust lines 102, 104 and 106. The layer deposition apparatus includes mass flow controllers (MFC) for controlling the flow of fluid flowing through associated pipes. The mass flow controllers are installed on the feed lines to properly control the flows of the gases.

The layer deposition methods according to first embodiments of the present invention have a cycle including: a first feed step for feeding a first reactant; a first purge step and a second purge step for purging the first reactant remaining; a second feed step for feeding a second reactant; and a third purge step for purging the second reactant. The cycle is performed repeatedly to form a layer of a prescribed thickness.

Figure 4:
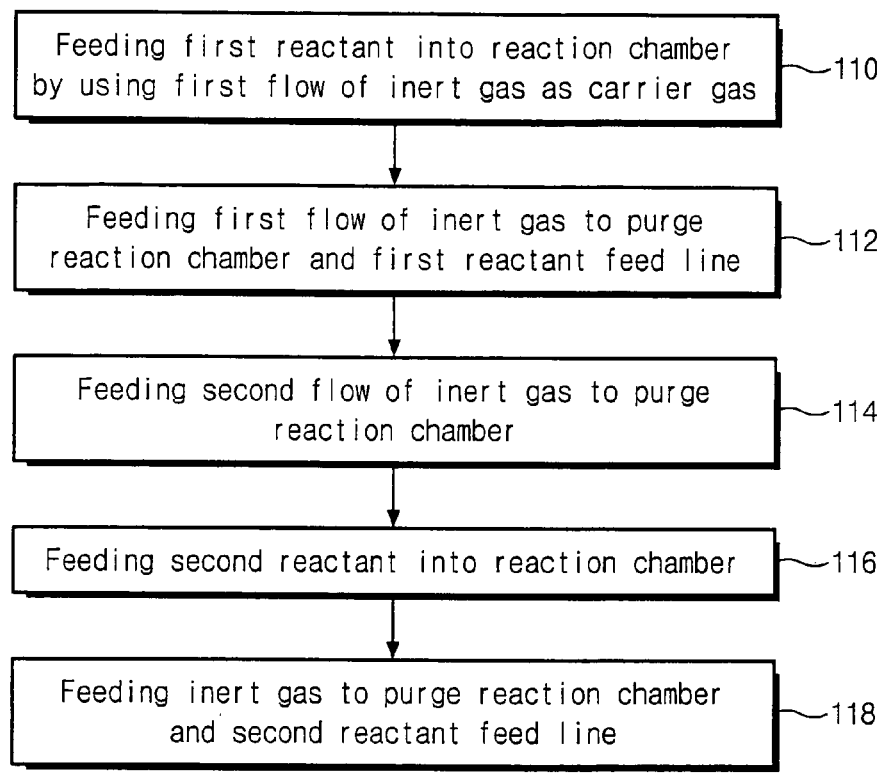
FIG. 4 is a flow chart representing layer deposition methods according to first embodiments of the present invention.
Figure 5:
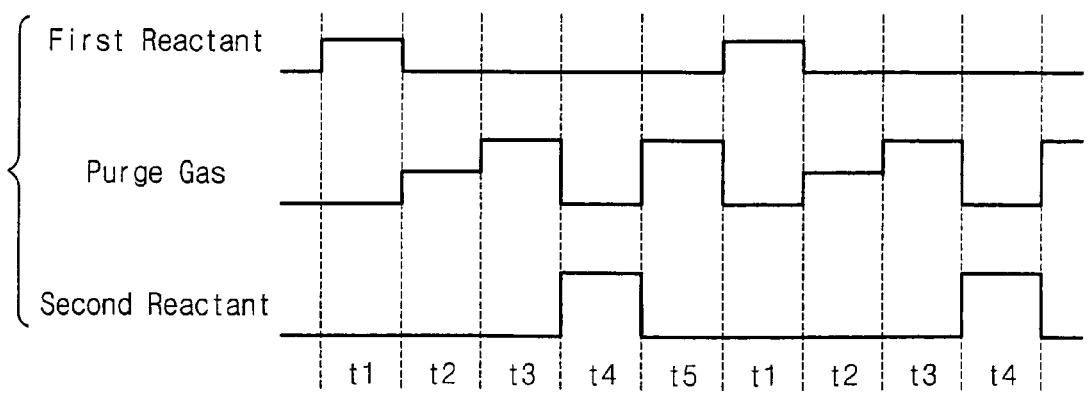
FIG. 5 is a timing diagram corresponding to the layer deposition methods according to the first embodiments of the present invention.

With reference to FIG. 4 and FIG. 5, in the first feed step t1, a first flow of the inert gas is used as the carrier gas to feed the first reactant into the reaction chamber Block 110. For example, an aluminum oxide layer can be formed by a chemical exchange reaction of $Al(CH_3)_3$ (tri-methyl aluminum) and $O_3$ (ozone). In this case, $Al(CH_3)_3$ is the first reactant. The first flow is of a small amount (i.e., mass) sufficient to allow an atomic unit or atomic monolayer of the reactant to be absorbed on a substrate placed in the reaction chamber. During the first feed step t1, the first reactant (a metallic compound, that is, $Al(CH_3)_3$) is fed. In the first feed step t1, the first reactant is chemisorbed and physisorbed on the substrate.

In the first purge step t2, the first flow of the inert gas is fed to remove the first reactant remaining within the reaction chamber and the first reactant feed line (Block 112). At this time, the inert gas is fed through a similar path as in the first feed step t1 (Block 110), and then bypasses upstream of the first reactant container to be fed into the first reactant feed line downstream of the first reactant container. Because the first flow is of a small amount (i.e., mass) and has a small mass flow rate, the pressure of the inert gas fed into the first reactant feed line and the reaction chamber is not sufficient to purge the reactant including the reactant that is distributed non-uniformly near the substrate. Accordingly, and in contrast to the conventional methods, an additional purge step is provided after the first purge step.

The second purge step t3 is performed to remove the first reactant not completely purged in the first purge step t2 and the first reactant physisorbed on the substrate from the interior of the reaction chamber (Block 114). The second purge step t3 serves to feed the second flow of the inert gas in a greater amount (i.e., mass) and with the same mass flow rate as or a greater mass flow rate than that of the inert gas fed in the first purge step t2 through the route different from that of the first purge step. As described above, because the mass flow controller cannot properly react within the short time range, it is desirable that the second flow of the inert gas to be fed into a different line from the first reactant feed line pass through the mass flow controller arranged to receive the second flow.

In the second feed step t4, the second flow of the inert gas is used as the carrier gas to feed the second reactant into the reaction chamber (Block 116). If a metallic oxide layer, a metallic nitride layer or a single metallic layer is formed, an oxidizing agent or a nitriding agent that is in a gas state at room temperature can be used as the second reactant. In this case, the oxidizing agent or the nitriding agent in a gas state can be fed directly into the reaction chamber without using the inert gas as the carrier gas. For example, if an aluminum oxide layer is formed, a second flow of ozone is fed into the reaction chamber. As a result, an aluminum oxide layer is formed on the substrate as an atomic unit layer by chemi-substitution-reacting with $Al(CH_3)_3$ chemisorbed on the substrate in the first feed step t1.

Once the second feed step t4 is completed, the third purge step t5 is performed to remove the second reactant (Block 118). In the third purge step t5, the second flow of the inert gas is fed into the reaction chamber through the second reactant feed line to remove the second reactant remaining within the second reactant feed line and the reaction chamber.

As illustrated in FIG. 5, the cycle including the first feed step t1 to the third purge step t5 is successively and repeatedly performed to form the layer of the prescribed thickness.

FIGS. 6 to 10 are schematic diagrams illustrating the respective gas feed paths for each step of the layer deposition method according to the first embodiments of the present invention.

Figure 6:
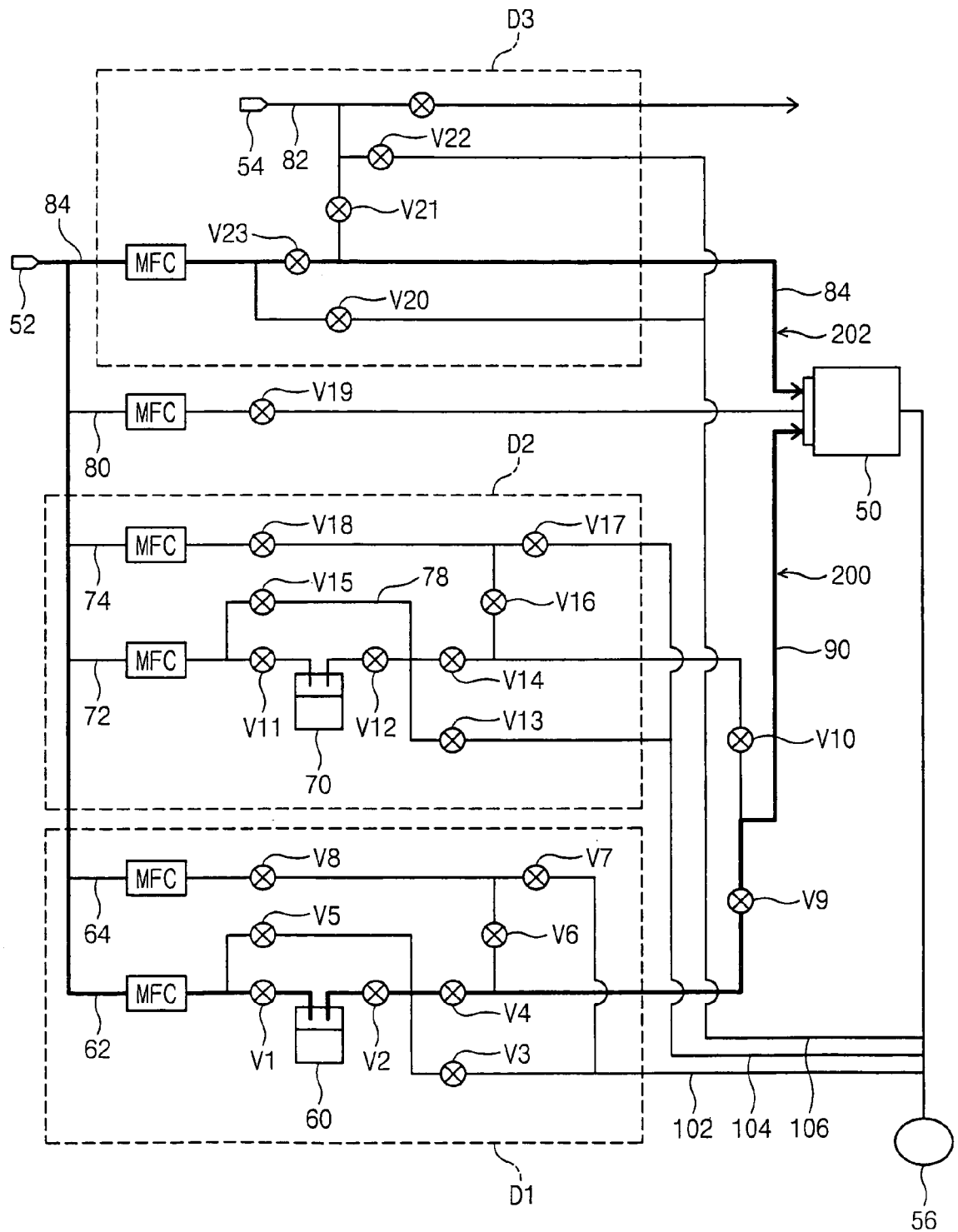
FIGS. 6 to 10 are schematic diagrams illustrating the respective gas feed paths of various steps of the layer deposition methods according to the first embodiments of the present invention.

Referring to FIG. 6, in the first feed step t1, the first flow of the inert gas is used as the carrier gas to feed the first reactant into the reaction chamber 50 through a first path 200. Valves V1, V2, V4 of the first reactant feeding unit D1 and a valve V9 are opened and valves V3, V5 are closed such that the first reactant stored in the first reactant container 60 is carried to the reaction chamber 50. At this time, the mass flow controller installed on a first feed line 62 is set to feed the first flow of the inert gas at a small mass flow rate such that a small amount of the first reactant is fed into the reaction chamber 50. The flow rate of the inert gas may be chosen properly in accordance to the molecular weight of the first reactant. At this time, valves V7, V8 installed on a second feed line 64 are opened and a valve V6 is closed such that the inert gas fed into the second feed line 64 is exhausted through a first exhaust line 102. The mass flow controller installed on the second feed line 64 is set to feed the second flow of the inert gas at a mass flow rate that is greater than that of first flow of the inert gas. Valves V22, V23 are opened and valves V20, V21 are closed in the second reactant feeding unit D3 to feed the inert gas into the reaction chamber 50 through a second path 202. The inert gas fed into the reaction chamber 50 through a third feed line 84 prevents the first reactant from flowing backward to the third feed line 84 as a result of an internal pressure difference between the third feed line 84 and the reaction chamber 50.

Figure 7:
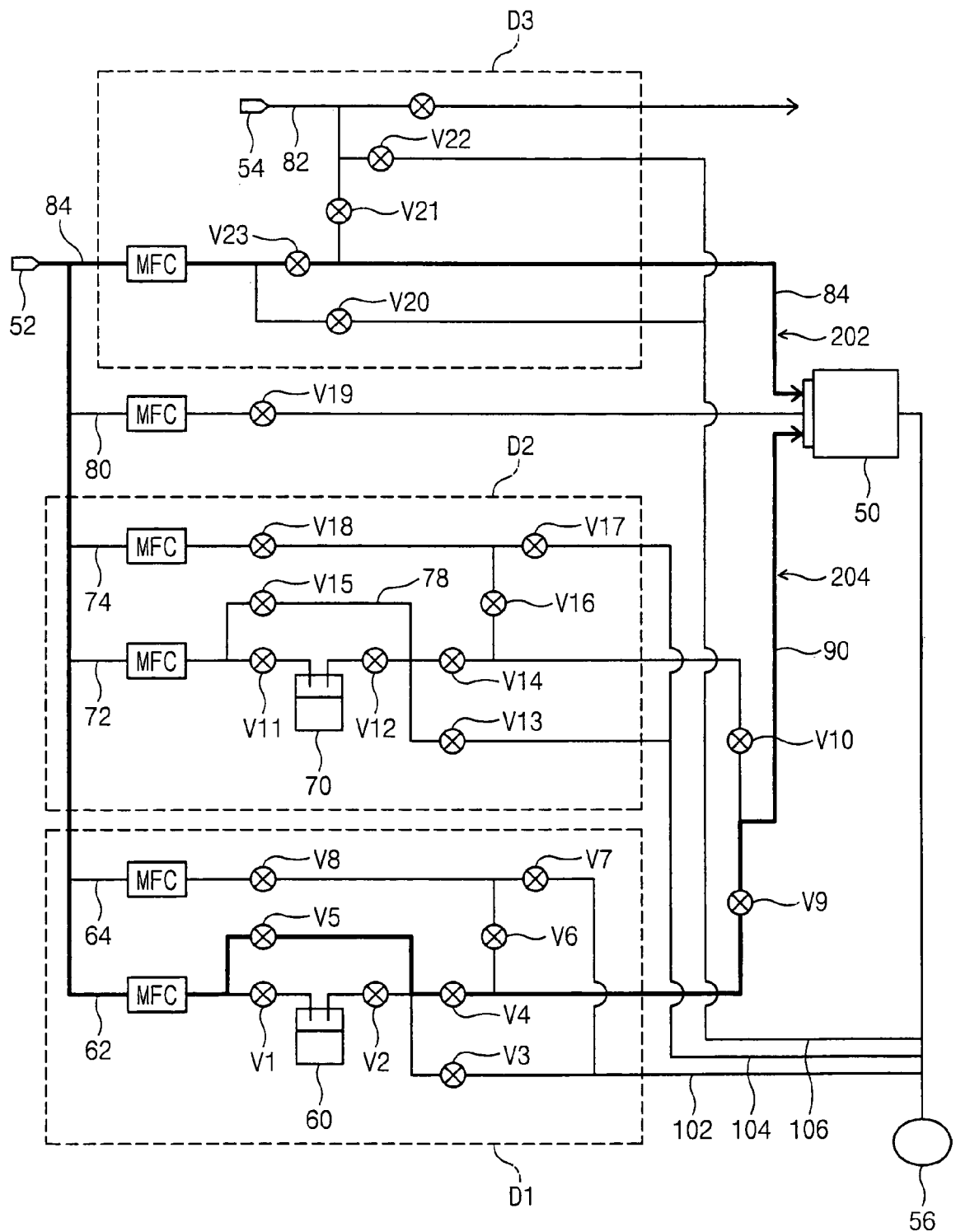

Referring to FIG. 7, in the first purge step t2, the valves V1, V2 are closed and the valve V5 is opened such that the inert gas directed to the reaction chamber 50 through a third path 204 bypasses the first reactant container 60. The other valves are maintained in the same state as in the first feed step t1. The mass flow controller installed on the first feed line 62 is set to provide the small mass flow rate of the first flow.

Figure 8:
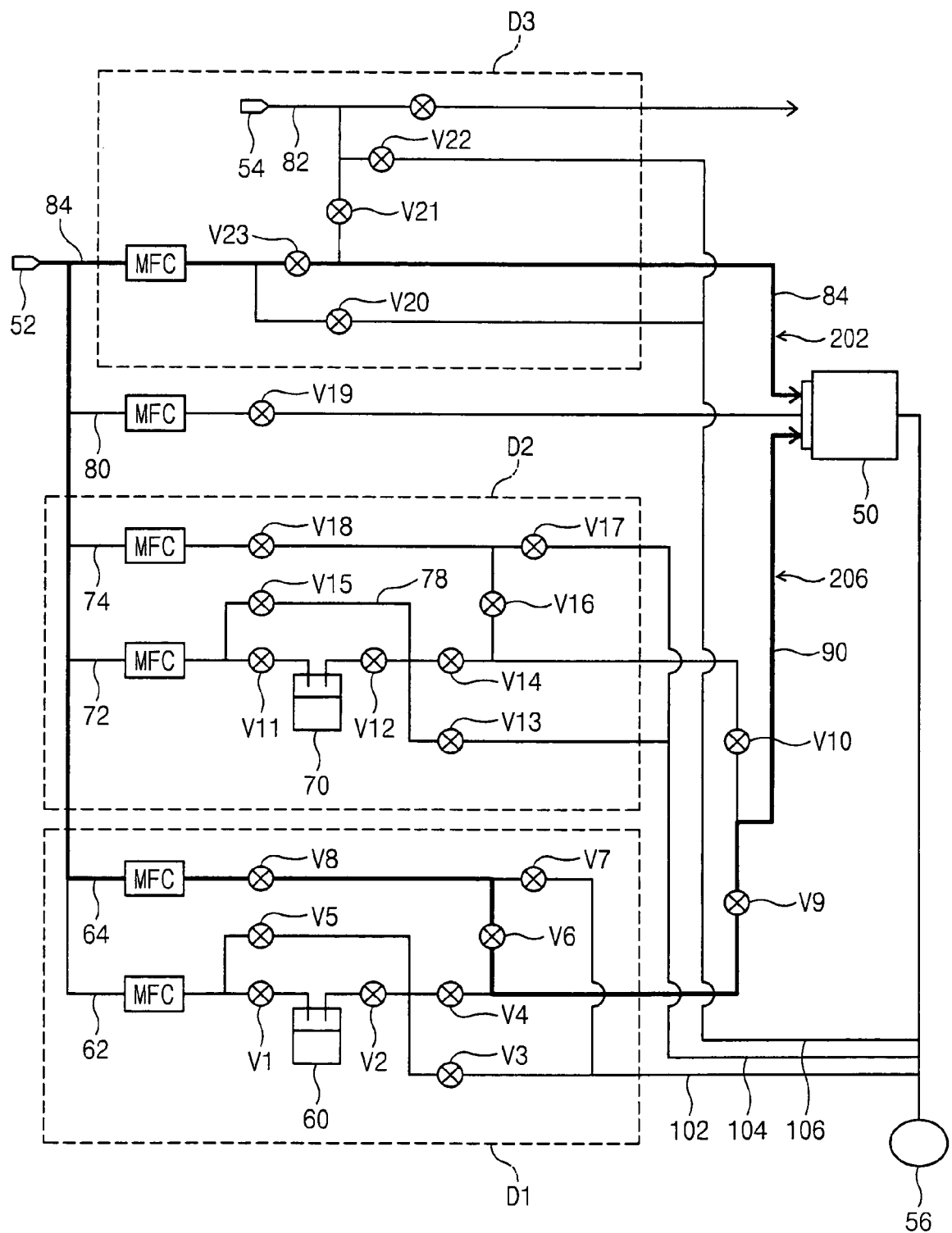

Referring to FIG. 8, in the second purge step t3, the valves V3, V6 are opened and the valves V4, V7 are closed such that the first flow of the inert gas fed into the first feed line 62 is exhausted through the first exhaust line 102 and the second flow of the inert gas fed into the second feed line 64 is fed into the reaction chamber 50 through a fourth path 206. Because the inert gas fed in the second purge step t3 is set by the mass flow controller installed on the second feed line 64 to the second mass flow rate, which is the same as or greater than that of the first flow, the first reactants not removed by the first flow of the inert gas may be removed. The mass flow rate of the second feed line may be chosen properly according to the molecular weight of the first reactant. If the first reactant is comparatively heavy, for example including Hf metal element, the flow rate of the second feed line may be chosen to be the same as or a little larger than that of the first flow. Where the first reactant is comparatively light, for example including Al metal element, its flow rate will be greater than that of the first flow. In the second purge step t3, in addition to the removal of the first reactant remaining within the reaction chamber 50 and the first reactant physisorbed on the substrate, the first reactant remaining within the first feed line 62 downstream of the valve V6 is also removed.

Figure 9:
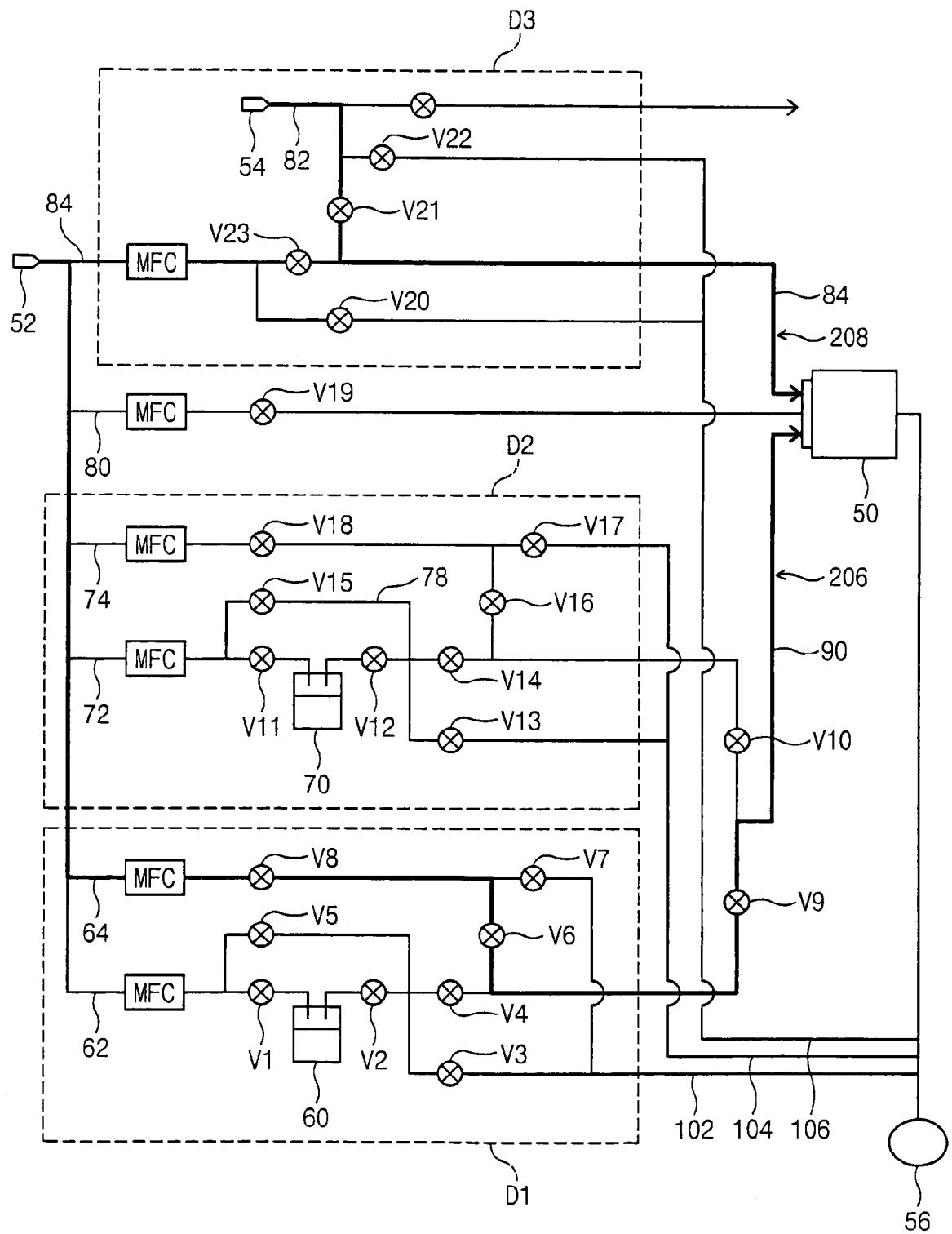

Referring to FIG. 9, the valves V20, V21 are then opened and the valves V22, V23 are closed in the second reactant feeding unit D3 such that the inert gas fed into the third feed line 84 is exhausted through the second exhaust line 106 and the second reactant is fed from a second reactant feeding source 54 into the reaction chamber 50 through a fifth path 208.

Figure 10:
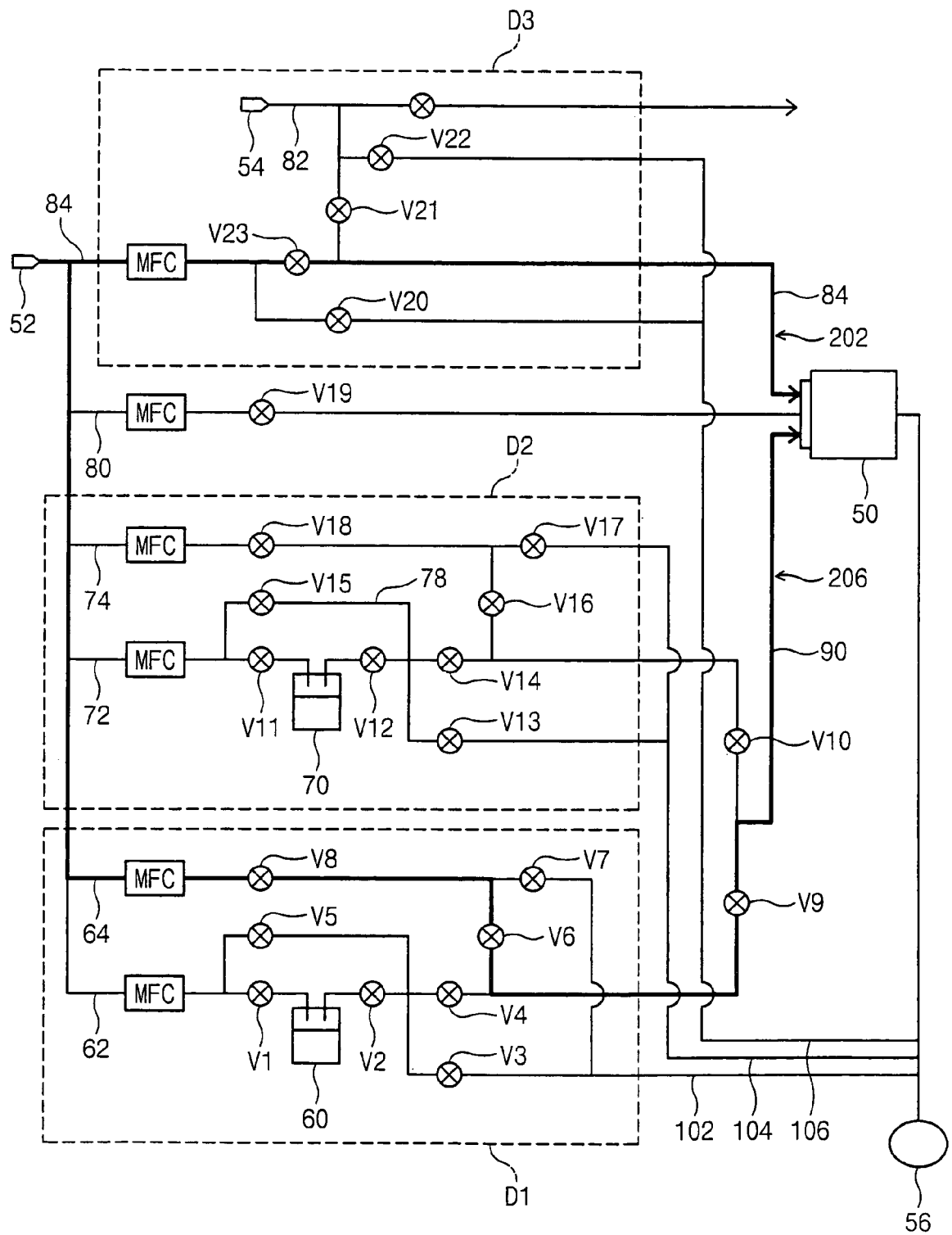

Referring to FIG. 10, the valve 21 is then closed and the valve 22 is opened to bypass the inert gas fed into the third feed line 84 toward the second exhaust line 106. Additionally, the valve 23 is opened and the valve 20 is closed to feed the second flow of the inert gas into the reaction chamber through the second path 202.

The steps of FIGS. 6 to 10 are performed repeatedly to form the layer of the prescribed thickness. The inert gas is continuously fed into the third feed line 80 at a certain mass flow rate and pressure. The inert gas fed through the third feed line 80 flows from an outer internal portion of the reaction chamber to a central portion thereof along an internal wall of the reaction chamber 50 to be exhausted to the exterior. As a result, the first reactant and the second reactant can be exhausted externally of the reaction chamber without being absorbed onto the internal wall of the reaction chamber.

The present invention can also be used in a layer deposition process for forming a layer by chemi-substitution-reacting two reactants having a liquid or solid state at room temperature and one reactant having a gas state at room temperature.

Figure 11:
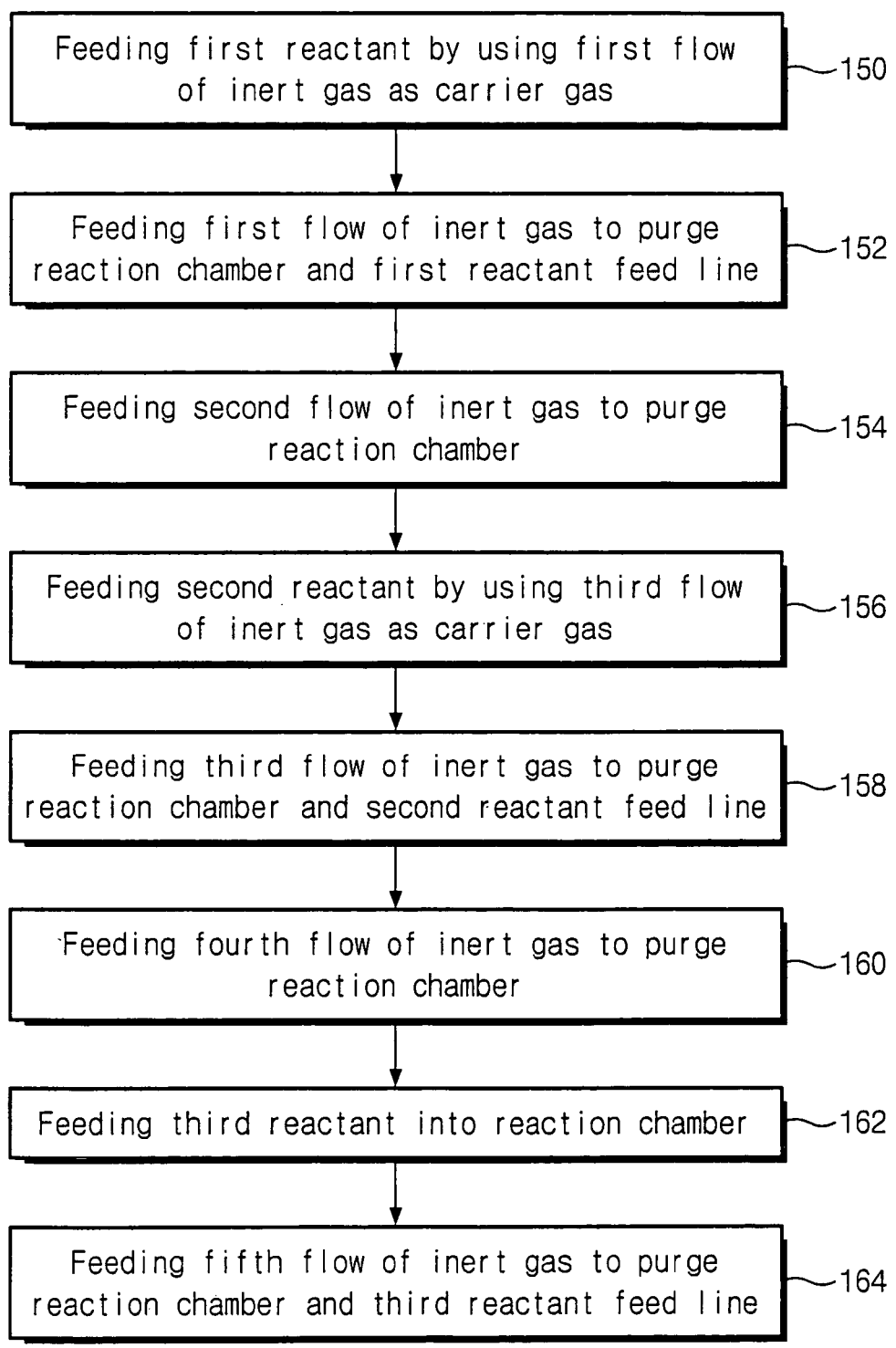
FIG. 11 is a flow chart representing layer deposition methods according to second embodiments of the present invention.
Figure 12:
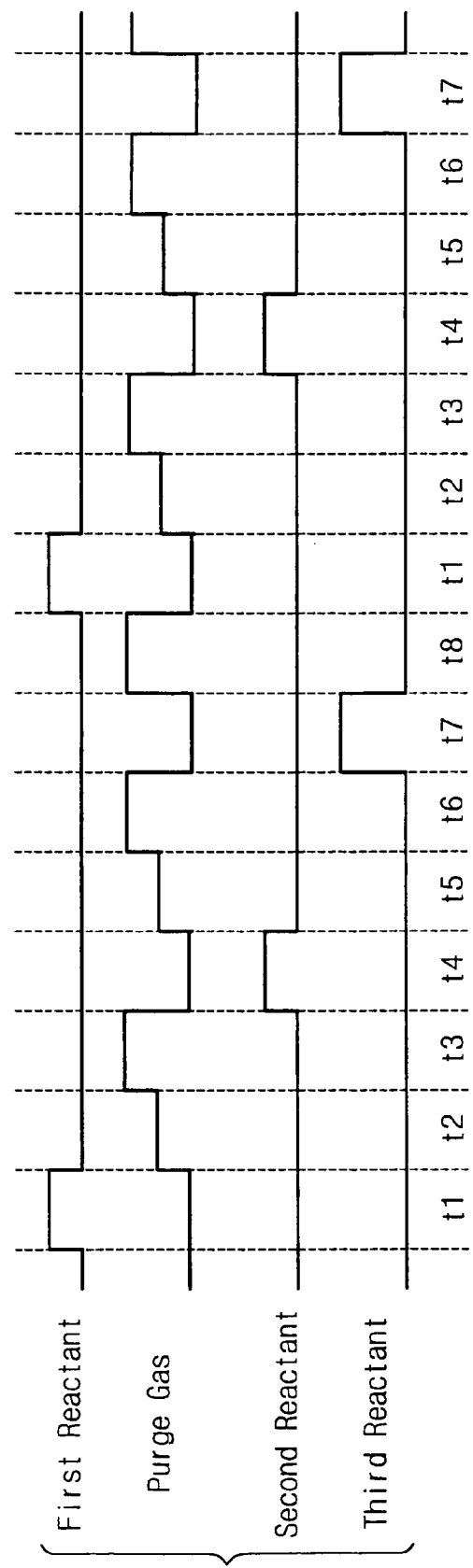
FIG. 12 is a timing diagram corresponding to the layer deposition methods according to the second embodiments of the present invention.

FIG. 11 is a flow chart illustrating layer deposition methods according to second embodiments of the present invention. FIG. 12 is a timing diagram illustrating the layer deposition methods according to the second embodiments of the present invention.

The second embodiments of the present invention have a cycle including: a first feed step for feeding a first reactant; a first purge step and a second purge step for purging the first reactant remaining; a second feed step for feeding a second reactant; a third purge step and a fourth purge step for purging the second reactant remaining; a third feed step for feeding a third reactant; and a fifth purge step for purging the third reactant remaining. The cycle is performed repeatedly to form a layer of a prescribed thickness.

With reference to FIG. 11 and FIG. 12, in the first feed step t1, a first flow of an inert gas is used as a carrier gas to feed the first reactant into the reaction chamber (Block 150). The first flow is of a small amount sufficient to allow an atomic layer unit or atomic monolayer of the reactant to be absorbed on a substrate. In the first feed step t1, the first reactant may be a metallic compound. In the first feed step t1, the first reactant is chemisorbed and physisorbed on the substrate which is disposed in the reaction chamber.

In the first purge step t2, the first flow of the inert gas is fed to remove the first reactant remaining within the reaction chamber and the first reactant feed line (Block 152). At this time, the fed inert gas is fed through a similar path as in the first feed step t1, and then bypasses upstream of the first reactant container to be fed into the first reactant feed line downstream of the first reactant container.

The second purge step t3 is performed to remove the first reactant not completely purged in the first purge step t2 from the interior of the reaction chamber as well as the first reactant physisorbed on the substrate (Block 154). The second purge step t3 serves to feed the second flow of the inert gas in an amount (i.e., mass) the same as or greater than that of the inert gas fed in the first purge step t2. As described above, because the mass flow controller cannot properly react within the short time range, it is desirable that the second flow of the inert gas to be fed into the first reactant feed line pass through the mass flow controller arranged to receive the second flow.

In the second feed step t4, a third flow of the inert gas is used as the carrier gas to feed the second reactant into the reaction chamber (Block 156). The third flow is of a small amount (i.e., mass) sufficient to allow the reactant of the atomic layer unit to be absorbed on the substrate. The second feed step t4 can be applied in the same or similar manner to that described above for the first feed step t1 when the second reactant is fed as the metallic compound. At this time, the mass flow rate of the third flow can be the same as or different from that of the first flow depending on the ratio of molecular weights of the first reactant and the second reactant. In general, the mass flow rate of the carrier gas is set in proportion to the molecular weight of the reactant fed.

In the second feed step t4, the second reactant and the first reactant chemisorbed on the substrate chemi-substitution-react such that a first compound is chemisorbed on the substrate. At this time, the first compound physisorbed by chemi-substitution-reacting the second reactant and the first reactant physisorbed are also disposed within the reaction chamber.

In the third purge step t5, the third flow of the inert gas is fed to remove the second reactant remaining within the reaction chamber and the second reactant feed line (Block 158). At this time, the fed inert gas bypasses upstream of the second reactant container to be fed into the second reactant feed line downstream of the second reactant container. The third flow of the inert gas fed into the reaction chamber may remove a portion of the first compound and the second reactant disposed within the reaction chamber.

The fourth purge step t6 is performed to remove the second reactant from the first compound physisorbed on the substrate and the interior of the reaction chamber not completely purged in the third purge step t5 (Block 160). The fourth purge step t6 serves to feed the fourth flow of the inert gas in a greater amount (i.e., mass) and at the same mass flow rate as or a greater mass flow rate than that of the inert gas fed in the third purge step t5. As described above, because the mass flow controller cannot properly react within the short time range, it is desirable that the second fourth flow of the inert gas to be fed into the second reactant feed line pass through the mass flow controller arranged to receive the fourth flow. The mass flow rate of the fourth flow can be the same as or different from the mass flow rate of the second flow, assuming the mass flow rate of the fourth flow is the same as or greater than that of the third flow.

In the third feed step t7, a fifth flow of the inert gas is used as the carrier gas to feed the third reactant into the reaction chamber (Block 162). However, an oxidizing agent or nitriding agent that is in a gas state at room temperature can be used as the third reactant. In this case, the oxidizing agent or the nitriding agent in a gas state can be fed directly into the reaction chamber without using the inert gas as the carrier gas. As a result, in the second feed step t4, the third reactant and the first compound chemisorbed on the substrate chemi-substitution-react with each other to form the layer of the atomic layer unit as an atomic monolayer on the substrate.

Once the third feed step t7 is completed, the fifth purge step t8 is performed to remove the third reactant (Block 164). In the fifth purge step t8, the fifth flow of the inert gas is fed into the reaction chamber through the third reactant feed line to remove the third reactant and byproducts remaining within the third reactant feed line and the reaction chamber.

As shown in FIG. 12, the cycle including the first feed step t1 to the fifth purge step t8 is successively and repeatedly performed to form the layer of the prescribed thickness.

FIGS. 13 to 20 are schematic diagrams illustrating the respective gas feed paths for each step of the layer deposition method according to the second embodiments of the present invention.

In the drawings, reactant feeding units D1, D2 are provided for feeding the reactant in the solid or liquid state at room temperature and correspond to first and second reactant feeding units. A gaseous reactant feeding unit D3 corresponds to a third reactant feeding unit.

Figure 13:
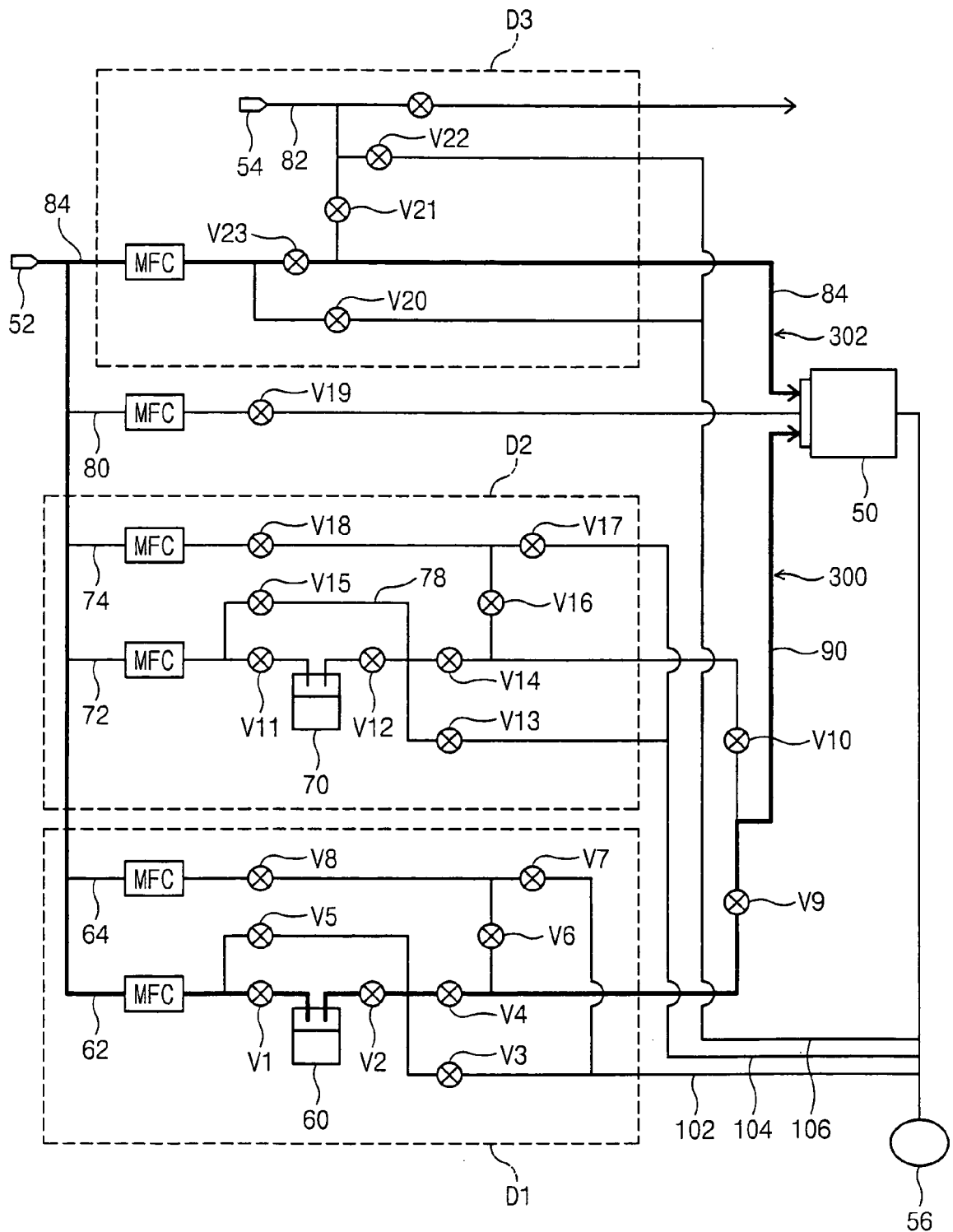
FIGS. 13 to 20 are views illustrating the respective gas feed paths of various steps of the layer deposition methods according to the second embodiments of the present invention.

Referring to FIG. 13, in the first feed step t1, the first flow of the inert gas is used as the carrier gas to feed the first reactant into the reaction chamber 50 through a first path 300. The valves V1, V2, V4 of the first reactant feeding unit D1 and a valve V9 are opened and the valves V3, V5 are closed such that the first reactant stored in the first reactant container 60 is carried to the reaction chamber 50. Then the mass flow controller installed on a first feed line 62 is set to feed the first flow of the inert gas such that a small amount of the first reactant is fed into the reaction chamber 50. At this time, the valves V7, V8 installed on a second feed line 64 are opened and a valve V6 is closed such that the inert gas fed into the second feed line 64 is exhausted through a first exhaust line 102. The mass flow controller installed on the second feed line 64 is set to feed the second flow of the inert gas at the same mass flow rate as or a greater mass flow rate than that of the first flow of the inert gas. At this time, the valves V13, V15, V17, V18 are opened, and the valves V11, V12, V14, V16 and a valve V10 are closed such that the inert gas fed into the third and fourth feed lines 72 and 74 is exhausted through the second exhaust line 104. Further, the valves V22, V23 are opened and the valves V20, V21 are closed in the third reactant feeding unit D3 to feed the inert gas into the reaction chamber 50 through a second path 202. The inert gas fed into the reaction chamber 50 through the fifth feed line 84 prevents the first reactant from flowing backward to the fifth feed line 84 as a result of an internal pressure difference between the fifth feed line 84 and the reaction chamber 50.

Figure 14:
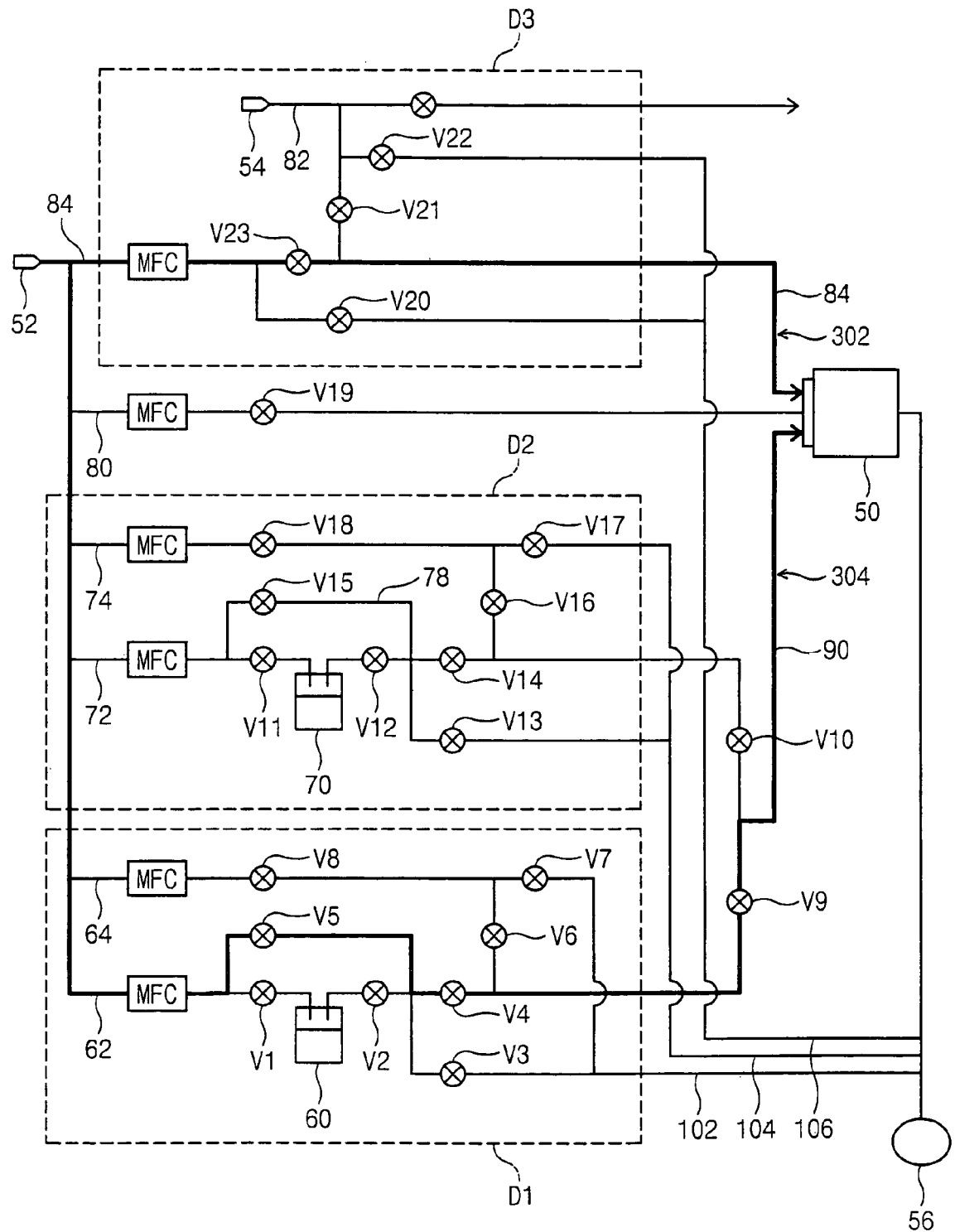

Referring to FIG. 14, in the first purge step t2, the valves V1, V2 are closed and the valve V5 is opened such that the inert gas directed to the reaction chamber 50 through a third path 304 bypasses the first reactant container 60. The other valves are maintained in the same state as in the first feed step t1. The mass flow controller installed on the first feed line 62 is set to provide the small mass flow rate of the first flow therethrough.

Figure 15:
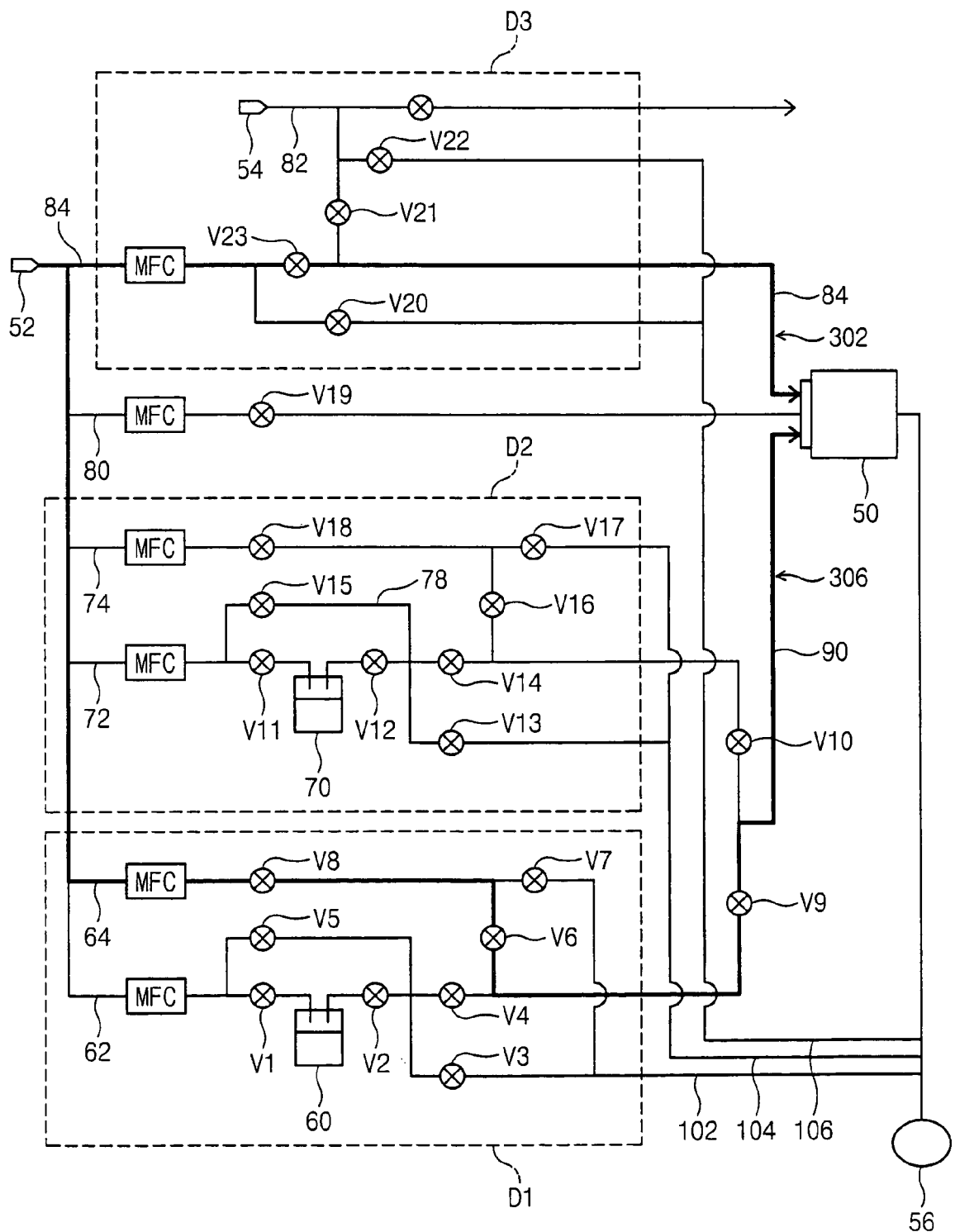

Referring to FIG. 15, in the second purge step t3, the valves V3, V6 are opened and the valves V4, V7 are closed to exhaust the first flow of the inert gas fed into the first feed line 62 through the first exhaust line 102, and to feed the second flow of the inert gas fed into the second feed line 64 into the reaction chamber 50 through a fourth path 306. Since the inert gas fed in the second purge step t3 is set by the mass flow controller installed on the second feed line 64 to the mass flow rate of the second flow, which is greater than that of the first flow, the first reactants not removed by the first flow of the inert gas can be removed. In the second purge step t3, in addition to the removal of the first reactant remaining within the reaction chamber 50 and the first reactant physisorbed on the substrate, the first reactant remaining within the first feed line 62 downstream of the valve V6 is removed.

Figure 16:
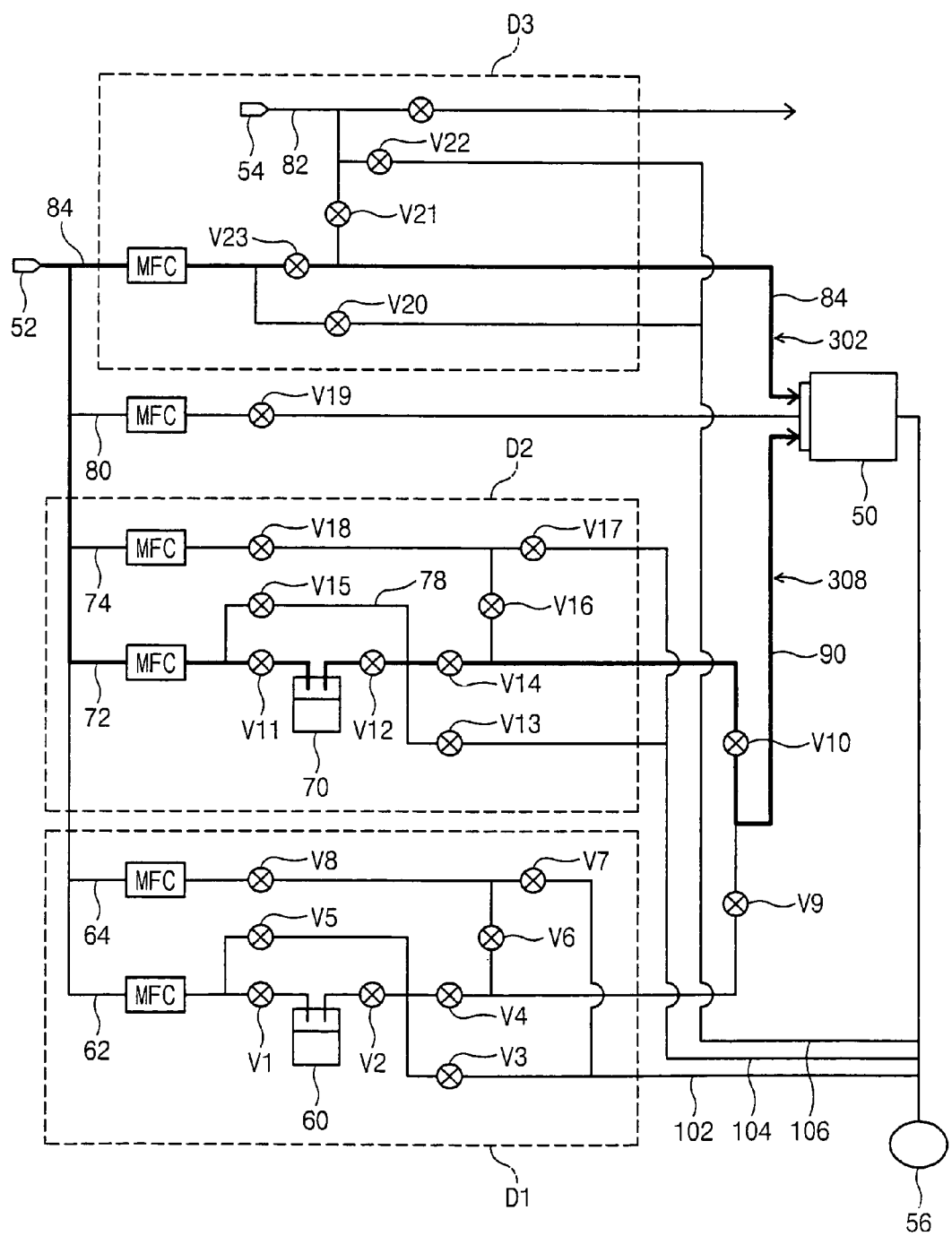

Referring to FIG. 16, in the second feed step t4, a third flow of the inert gas is used as the carrier gas to feed the second reactant into the reaction chamber 50 through a fifth path 308. The valves operate such that the inert gas fed into the first reactant feeding unit is exhausted to the exterior through the first exhaust line 102, and the valves V11, V12, V14 of the second reactant feeding unit D2 and the valve V10 are opened and the valves V13, V15 are closed such that the second reactant stored in the second reactant container 70 is carried to the reaction chamber 50. At this time, the mass flow controller installed on a third feed line 72 is set to feed the third flow of the inert gas such that a small amount of the second reactant is fed into the reaction chamber 50. At this time, the valves V17, V18 installed on a fourth feed line 74 are opened and the valve V16 is closed such that the inert gas fed into the fourth feed line 74 is exhausted through a second exhaust line 104. The mass flow controller installed on the fourth feed line 74 is set to feed the fourth flow of the inert gas at a greater mass flow rate than that of the third flow of the inert gas. The valves V22, V23 of the third reactant feeding unit D3 are opened and the valves V20, V21 are closed to feed the inert gas into the reaction chamber 50 through a fifth feed line 84. The inert gas fed into the reaction chamber 50 through the fifth feed line 84 prevents the first reactant from flowing backward into the fifth feed line 84 as a result of an internal pressure difference between the fifth feed line 84 and the reaction chamber 50.

Figure 17:
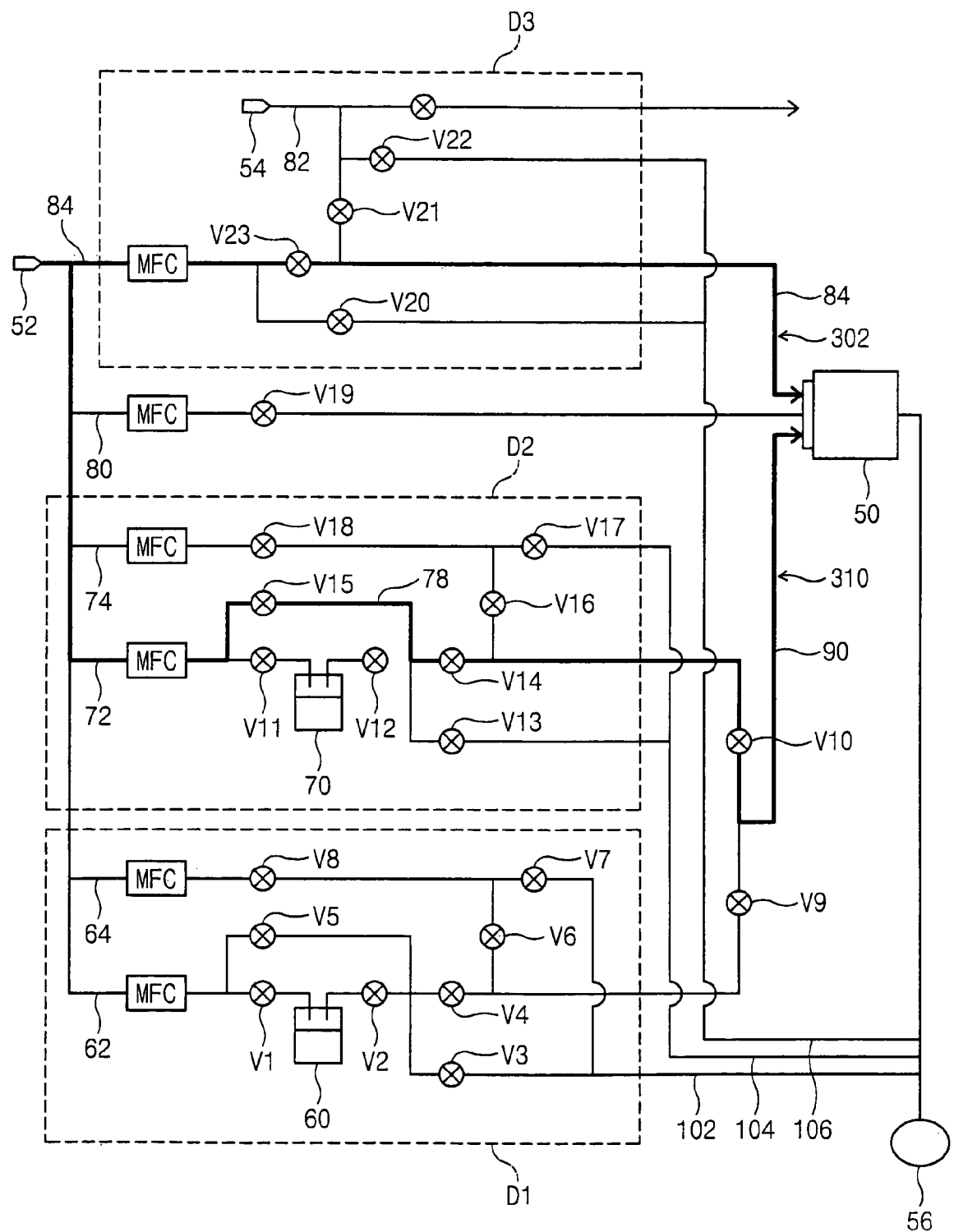

Referring to FIG. 17, in the third purge step t5, the valves V11, V12 are closed and the valve V15 is opened such that the inert gas directed to the reaction chamber 50 through a sixth path 310 bypasses the second reactant chamber 70.

Figure 18:
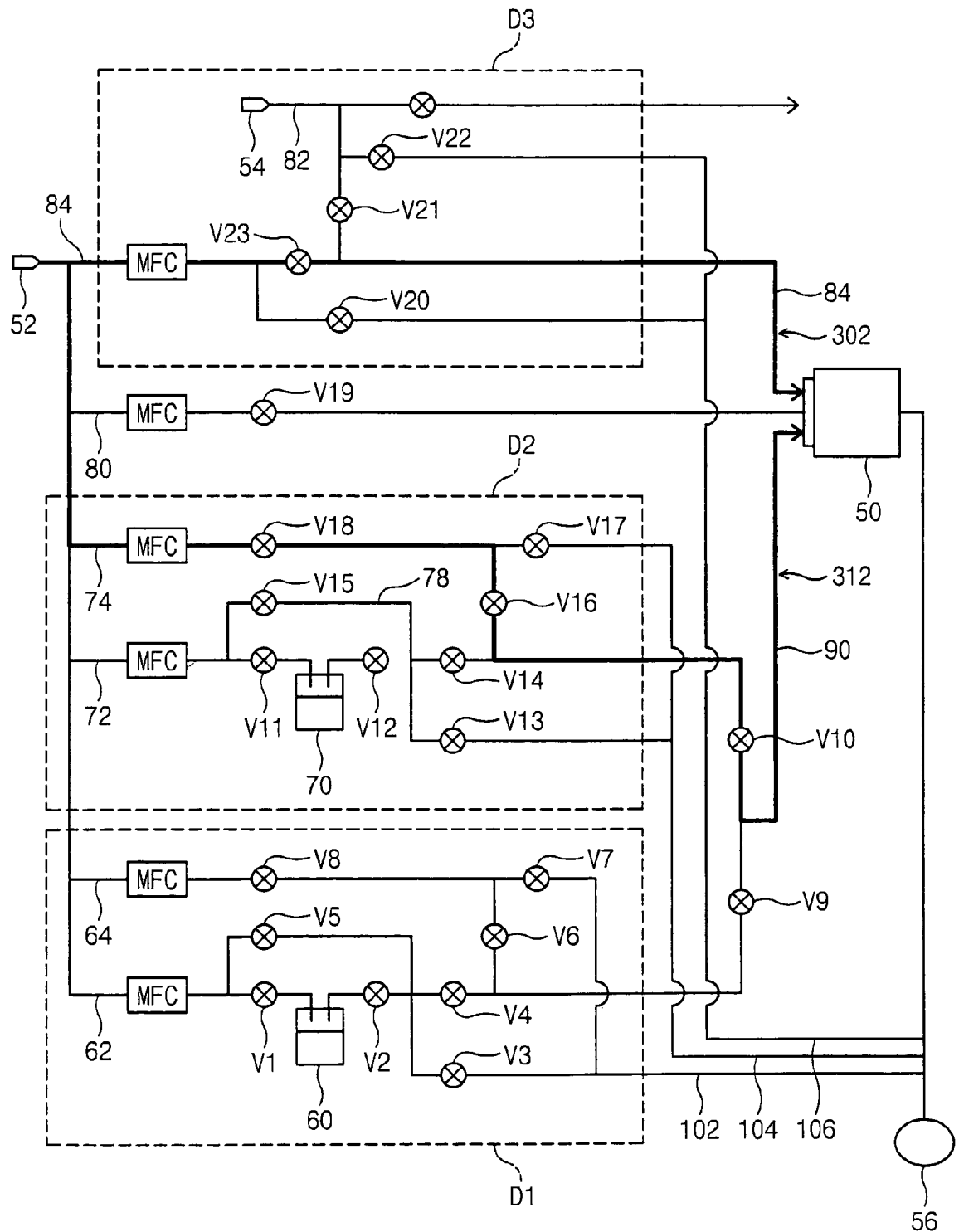

Referring to FIG. 18, in the fourth purge step t6, the valves V13, V16 are opened and the valves V14, V17 are closed such that the third flow of the inert gas fed into the third feed line 72 is exhausted through the second exhaust line 104, and the fourth flow of the inert gas fed into the fourth feed line 74 is fed into the reaction chamber 50 through a seventh path 312. Since the mass flow rate of the inert gas fed in the fourth purge step t6 is set by the mass flow controller installed on the second feed line 64 to the mass flow rate of the fourth flow, which is greater than that of the third flow, the second reactants not removed by the third flow of the inert gas can be removed. In the fourth purge step t6, in addition to the removal of the first reactant remaining within the reaction chamber 50 and the first compound and the second reactant physisorbed on the substrate, the second reactant remaining within the first feed line 62 downstream of the valve V6 is removed.

The first flow and the third flow may differ from one other in accordance with the molecular weights of the first reactant and the second reactant. For example, if the molecular weight of the second reactant is larger than that of the first reactant, the third flow will be of a greater amount (i.e., mass) than that of the first flow. The second flow and the fourth flow can be, assuming their greater amount (i.e., mass), respectively the same as or different from the first flow and the third flow. The second flow and the fourth flow should be sufficient to remove the reactant remaining within the reaction chamber and the feed line, including the reactant that is physisorbed within the reaction chamber.

Figure 19:
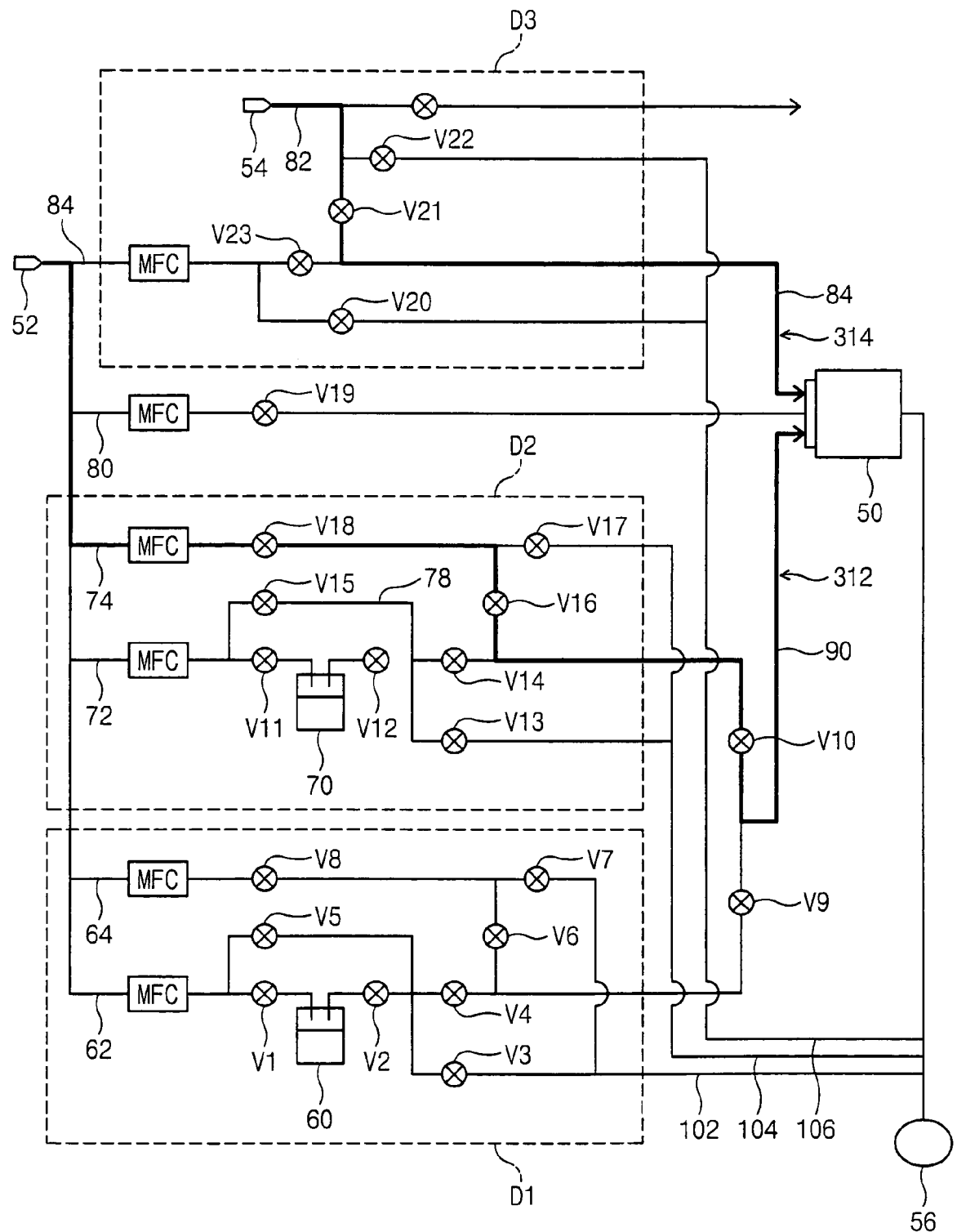

Referring to FIG. 19, the valves V20, V21 are opened and the valves V22, V23 are closed in the third reactant feeding unit D3 such that the inert gas fed into the fifth feed line 84 is exhausted through the third exhaust line 106. The third reactant is fed from a third reactant feeding source 54 into the reaction chamber 50 through an eighth path 314.

Figure 20:
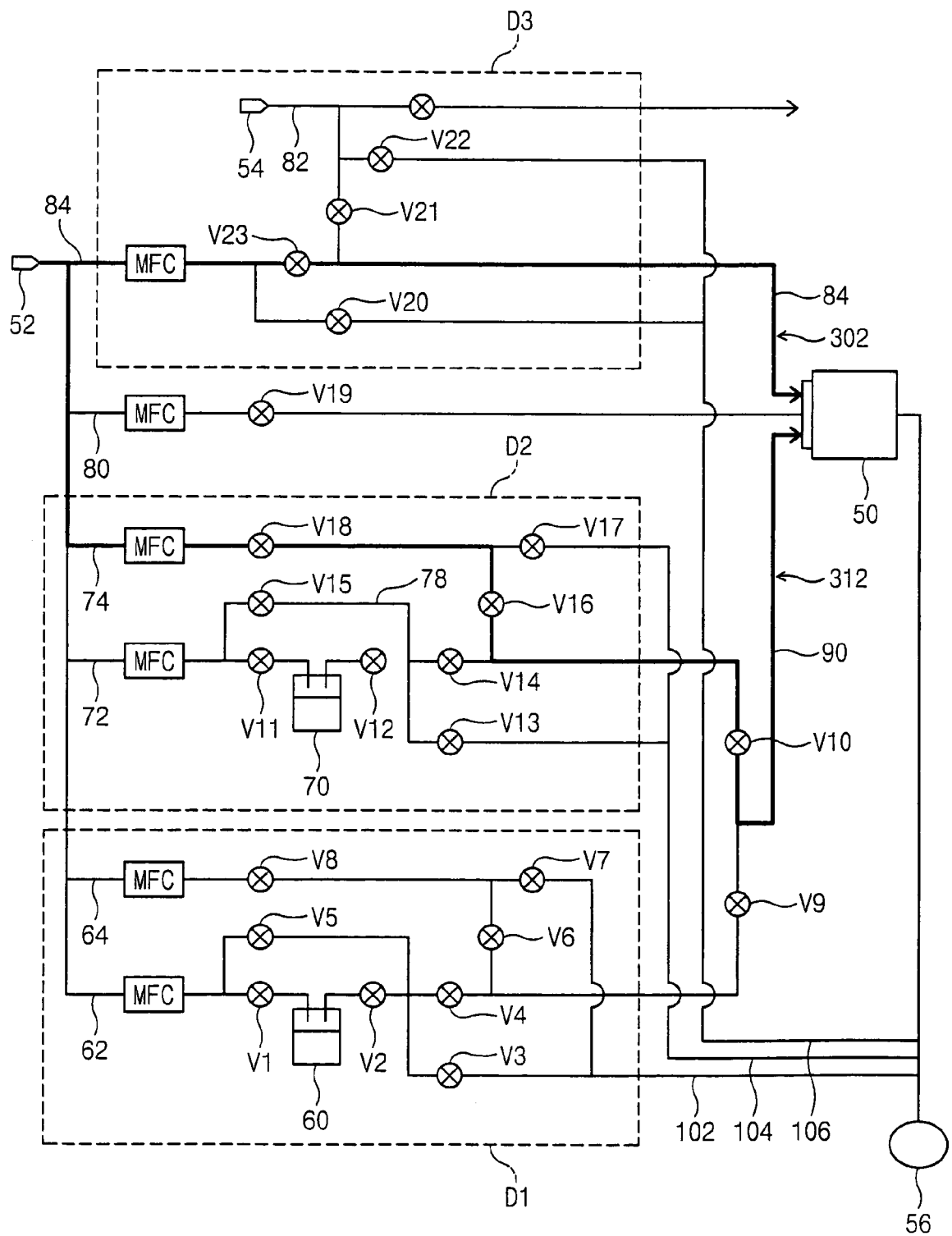

Referring to FIG. 20, the valve 21 is closed and the valve 22 is opened such that the inert gas fed into the fifth feed line 84 is bypassed to the third exhaust line 106. Additionally, the valve 23 is opened and the valve 20 is closed to feed the fifth flow of the inert gas into the reaction chamber through the second path 302. The mass flow rate of the fifth flow can be the same as or different from the mass flow rate(s) of the second flow and the fourth flow.

The steps of FIGS. 13 to 20 are performed repeatedly to form the layer of the prescribed thickness. The inert gas is continuously fed into the seventh feed line 80 at a certain mass flow rate and pressure. The inert gas fed through the seventh feed line 80 flows from an outer internal portion of the reaction chamber to the central portion thereof along an internal wall of the reaction chamber 50 to be exhausted externally of the reaction chamber. Consequently, the first reactant and the second reactant can be exhausted to the exterior without being absorbed onto the internal wall of the reaction chamber. Further, the inert gas can therefore be fed into the feed lines connected to the reaction chamber 50 so as to prevent undesirable backflow of the inert gas and the reactant.

The above-described embodiments can be used to form a single-atomic solid layer of, for example, single-atomic oxide, complex oxide, single-atomic nitride or complex nitride. Specifically, greater effect may be achieved where the material used as the precursor is a metal-containing material. The single-atomic layer can be exemplified as molybdenum (Mo), aluminum (Al), copper (Cu), platinum (Pt), iridium (Ir), tungsten (W), ruthenium (Ru), etc. The single-atomic oxide can be exemplified as aluminum oxide ($Al_2O_3$), titanium oxide ($TiO_2$), hafnium oxide ($HfO_2$), tantalum oxide ($Ta_2O_5$), zirconium oxide ($ZrO_2$), and yttrium oxide ($Y_2O_3$), etc. The complex oxide can be exemplified as $SrTiO_3$, $PbTiO_3$, $SrRuO_3$, (Ba, Sr) $TiO_3$, Pb(Zr, Ti)$O_3$, (Pb, La)(Zr, Ti)$O_3$, (Sr, Ca)$RuO_3$, HfSiO, ZrSiO, etc. Additionally, the present invention can be applied to a process for forming a nitride such as $Si_3N_4$, TiN, TaN, AlN, WN, NbN, etc., sulfide such as PbS, CdS, ZnS, etc., a compound such as $Ta_2O_5$ having SiC or Ti doped thereinto, a complex nitride such as WBN, WSiN, TiSiN, AlSiN, AlTiN, etc.

Table 1 represents process conditions for an exemplary process in accordance with the present invention and an exemplary conventional process in accordance with the prior art wherein each is used to form an aluminum oxide layer ($Al_2O_3$). Table 2 represents a comparison of deposition characteristics achieved by the process in accordance with the present invention and the exemplary conventional process. The aluminum oxide layer is formed by reacting $Al(CH_3)_3$ and $O_3$, at a deposition temperature of 450° C. and a deposition pressure of 1 torr, as applied to one hundred wafers.

TABLE 1

| | Process conditions | | | | |
|---|---|---|---|---|---|
| | Conventional Art | | Present invention | | |
| Process step | Feed time | Feed flow | Feed time | Feed flow | |
| First feed step | 0.2 sec | $Al(CH_3)_3$ + Ar; 100 sccm | 0.2 sec | $Al(CH_3)_3$ + Ar; 100 sccm | |
| First purge step | 1 sec | Ar; 100 sccm | 0.5 sec 0.5 sec | Ar; 100 sccm Ar; 450 sccm | 2 step purge |
| Second feed step | 1.5 sec | $O_2 + O_3$; 450 sccm | 1.5 sec | $O_2 + O_3$; 450 sccm | |
| Second purge step | 1.5 sec | Ar; 400 sccm | 1.5 sec | Ar; 400 sccm | |

As illustrated in Table 1, the present invention exemplary process and the exemplary conventional process each include feeding a mixed gas of $Al(CH_3)_3$ and Ar at a mass flow rate of 100 sccm (standard cubic centimeters per minute) for 0.2 second in the first feed step, feeding a mixed gas of $O_2$ and $O_3$ at a flow rate of 450 sccm for 1.5 seconds in the second feed step, and feeding Ar at a mass flow rate of 400 sccm for 1.5 seconds in the second purge step. However, in the first purge step, the exemplary conventional process includes feeding argon at a mass flow rate of 100 sccm for 1 second, whereas the present invention process includes feeding argon at a mass flow rate of 100 sccm for 0.5 second and then feeding argon at a mass flow rate of 450 sccm for 0.5 second, as a two-step purge. Accordingly, other than the two-step purge, the process conditions used for the present invention exemplary process and the exemplary conventional process are the same.

Table 2 represents the deposition characteristics achieved by the present invention exemplary process and the exemplary conventional process, each performed under the process conditions of Table 1.

TABLE 2

| Deposition characteristics | | |
|---|---|---|
| | Conventional art | Present invention |
| Average of deposition thickness (Å) | 48.1 | 42.7 |
| Uniformity by wafer (%) | 3.5 | 1.1 |
| Uniformity in wafer (%) | 4.2 | 1.4 |
| Contaminative particle (number) | 75 to 91 | 0 to 7 |

As shown in Table 2, because the present invention exemplary process forms a thinner deposited layer than the exemplary conventional process in the same amount of time, it is easier to control the thickness of the layer, and the uniformity as between the wafers as well as the uniformity in each of the wafers is excellent and superior to that achieved by the exemplary conventional process. Additionally, it can be appreciated that the number of contaminative particles or impurities is much lower in a specimen formed using the present invention exemplary process than in a specimen formed using the exemplary conventional process.

As described above, the present invention can reduce the amount of the reactant that is fed such that a uniform atomic layer is formed on the substrate, and can prevent non-uniformity of the layer caused by unnecessary reaction and absorption. Further, because a small amount of carrier gas is used to feed the reactant and a large amount of purge gas is used to purge the reactant feed line, the apparatus can be effectively purged even where the process requires that the feed amount of the reactant be limited.

Accordingly, the present invention can be applied to multiple layer deposition processes. Specifically, the present invention may be very effective in purging the process chamber and the purging of the feed line in a process employing a precursor that is liquid or solid at room temperature and which is difficult to manufacture or which includes an expensive metallic precursor.

Layer deposition methods in accordance with the present invention may substantially obviate one or more of the problems due to limitations and disadvantages of the related art as discussed above. The layer deposition methods of the present invention may reduce the consumption of reactant and effectively purge a reactant feed line and a reaction chamber. The layer deposition methods of the present invention may reduce consumption of reactant while improving purge capacity.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

What is claimed is:

1. A layer deposition method, comprising the steps of:
   feeding a reactant with a first flow of an inert gas as a carrier gas at a first mass flow rate into a reaction chamber to chemisorb the reactant on a substrate; thereafter
   feeding the first flow of the inert gas, without the reactant, at the first mass flow rate to purge the reaction chamber and a first reactant feed line; and
   feeding a second flow of the inert gas into the reaction chamber at a second mass flow rate through a feed line different from the first reactant feed line to purge the reaction chamber;
   wherein the second mass flow rate is greater than the first mass flow rate.

2. The layer deposition method of claim 1, wherein the first flow of the inert gas is fed into the reaction chamber through the first reactant feed line during the step of feeding the second flow of the inert gas.

3. The layer deposition method of claim 1, wherein the step of feeding the first flow of the inert gas includes purging the reactant disposed within the first reactant feed line and the reaction chamber and physisorbed on the substrate.

4. The layer deposition method of claim 1, wherein the step of feeding the second flow of the inert gas includes purging the reactant disposed within the reaction chamber and the reactant physisorbed on the substrate.

5. The layer deposition method of claim 1, wherein the reactant is a metal-containing compound.

6. The layer deposition method of claim 1, further comprising the steps of:
   feeding a second reactant with a third flow of the inert gas as a carrier gas to form a chemical exchange layer in which a chemical exchange reaction is performed with the first reactant;
   feeding the third flow of the inert gas through a second reactant feed line to purge the reaction chamber and the second reactant feed line; and
   feeding a fourth flow of the inert gas into the reaction chamber through a feed line different from the second reactant feed line.

7. The layer deposition method of claim 6, wherein the fourth flow has the same mass flow rate as or a greater mass flow rate than the second flow.

8. The layer deposition method of claim 6, wherein the first flow of the inert gas is fed into the reaction chamber through the first reactant feed line during the step of feeding the second flow of the inert gas, and the third flow of the inert gas is fed into the reaction chamber through the second reactant feed line during the step of feeding the fourth flow of the inert gas.

9. The layer deposition method of claim 6, wherein the step of feeding the first flow of the inert gas includes purging the first reactant disposed within the first reactant feed line and the reaction chamber and the first reactant physisorbed on the substrate, and the step of feeding the third flow of the inert gas includes purging the second reactant disposed within the second reactant feed line and the reaction chamber and the second reactant physisorbed on the substrate.

10. The layer deposition method of claim 6, wherein the second flow of the inert gas is used to purge the first reactant disposed within the reaction chamber and the first reactant physisorbed on the substrate, and the fourth flow of the inert gas is used to purge the second reactant disposed within the reaction chamber and the second reactant physisorbed on the substrate.

11. The layer deposition method of claim 6, wherein the first reactant and the second reactant are metal-containing compounds.

12. The layer deposition method of claim 6, further comprising the steps of:

feeding a third reactant into the reaction chamber to form a chemical exchange layer in which a chemical exchange reaction is additionally performed; and purging the reaction chamber and a third reactant feed line using the inert gas.

13. The layer deposition method of claim 12, wherein the third reactant is an oxidizing agent or a nitriding agent.

14. The layer deposition method of claim 1, further comprising the steps of:

feeding a second reactant into the reaction chamber to form a layer in which a chemical exchange reaction is performed with the first reactant; and feeding the inert gas to purge the reaction chamber and the second reactant feed line.

15. The layer deposition method of claim 14, wherein the step of feeding the second flow of the inert gas includes feeding the second flow of the inert gas into the reaction chamber through a feed line different from the first reactant feed line.

16. The layer deposition method of claim 14, wherein the first flow of the inert gas is fed into the reaction chamber through the first reactant feed line during the step of feeding the second flow of the inert gas.

17. The layer deposition method of claim 14, wherein the step of feeding the first flow of the inert gas includes purging the first reactant disposed within the first reactant feed line and the reaction chamber and the first reactant physisorbed on the substrate.

18. The layer deposition method of claim 14, wherein the step of feeding the second flow of the inert gas includes using the second flow of the inert gas to purge the first reactant disposed within the reaction chamber and the first reactant physisorbed on the substrate.

19. The layer deposition method of claim 14, wherein the first reactant is a metal-containing compound and the second reactant is an oxidizing agent or a nitriding agent.

20. The layer deposition method of claim 1 wherein:

the step of feeding the first flow of the inert gas includes feeding the first flow of the inert gas through a first mass flow controller; and the step of feeding the second flow of the inert gas includes feeding the second flow of the inert gas through a second mass flow controller different than the first mass flow controller;

wherein the second mass flow controller has a greater flow rate than the first mass flow controller.

21. The layer deposition method of claim 1 including ceasing feeding the first flow of the inert gas to purge the reaction chamber and the first reactant feed line, wherein the step of feeding the second flow of the inert gas is executed after the step of ceasing feeding the first flow of the inert gas to purge the reaction chamber and the first reactant feed line and before another reactant is fed into the reaction chamber.

22. A layer deposition method, comprising the steps of:

feeding a reactant with a first flow of an inert gas as a carrier gas into a reaction chamber to chemisorb the reactant on a substrate; thereafter feeding the first flow of the inert gas to purge the reaction chamber and a first reactant feed line;

ceasing feeding the first flow of the inert gas to purge the reaction chamber and the first reactant feed line; and thereafter feeding a second flow of the inert gas into the reaction chamber through a feed line different from the first reactant feed line before another reactant is fed into the reaction chamber.

23. The layer deposition method of claim 22 wherein:

the step of feeding the first flow of the inert gas includes feeding the first flow of the inert gas through a first mass flow controller; and the step of feeding the second flow of the inert gas includes feeding the second flow of the inert gas through a second mass flow controller different than the first mass flow controller;

wherein the second mass flow controller has a greater flow rate than the first mass flow controller.

* * * * *